United States Patent
Sim et al.

(10) Patent No.: US 11,653,520 B2
(45) Date of Patent: May 16, 2023

(54) DISPLAY DEVICE

(71) Applicant: Samsung Display Co., LTD., Yongin-si (KR)

(72) Inventors: Jin Yong Sim, Seongnam-si (KR); Sung Chul Choi, Hwaseong-si (KR); In Soo Park, Hwaseong-si (KR); Dongwoo Seo, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/186,793

(22) Filed: Feb. 26, 2021

(65) Prior Publication Data
US 2021/0408445 A1     Dec. 30, 2021

(30) Foreign Application Priority Data
Jun. 26, 2020  (KR) ..................... 10-2020-0078744

(51) Int. Cl.
*G06F 1/16*     (2006.01)
*H01L 51/52*    (2006.01)
*F16C 11/04*    (2006.01)

(52) U.S. Cl.
CPC .......... *H01L 51/5237* (2013.01); *F16C 11/04* (2013.01); *G06F 1/1681* (2013.01); *H01L 2251/5338* (2013.01)

(58) Field of Classification Search
CPC ......... H01L 51/5237; H01L 2251/5338; F16C 11/04; G06F 1/1681; G06F 1/1652; H04M 1/022; H04M 1/0268; G09F 9/301
See application file for complete search history.

(56) References Cited

U.S. PATENT DOCUMENTS

| 9,250,733 | B2 | 2/2016 | Lee et al. | |
| 9,348,450 | B1* | 5/2016 | Kim | ..................... G06F 1/1616 |
| 9,600,035 | B2* | 3/2017 | Park | ..................... G06F 1/1681 |
| 9,857,832 | B2 | 1/2018 | Kim et al. | |

(Continued)

FOREIGN PATENT DOCUMENTS

| CN | 109461381 A | * | 3/2019 | ............. G09F 9/301 |
| CN | 110502073 | | 11/2019 | |

(Continued)

OTHER PUBLICATIONS

Translation for KR20150133948, Translation generated on Oct. 19, 2022 (Year: 2015).*

*Primary Examiner* — Abhishek M Rathod
(74) *Attorney, Agent, or Firm* — Kile Park Reed & Houtteman PLLC

(57) ABSTRACT

A display device includes a display module including a first non-folding area, a second non-folding area, and a folding area disposed between the first and second non-folding areas which are arranged in a first direction, a first support disposed below the first non-folding area, a second support disposed below the second non-folding area, and a hinge including a biaxial rotation shaft disposed between the first support and the second support, the biaxial rotation shaft extending in a second direction intersecting the first direction. The folding area has a curvature radius in a range of about 1.5 mm to about 5.0 mm when the display module is folded by a rotation of the first support and the second support with respect to the biaxial rotation shaft.

19 Claims, 18 Drawing Sheets

(56) References Cited

U.S. PATENT DOCUMENTS

| | | | |
|---|---|---|---|
| 10,104,790 B2* | 10/2018 | Lee | H04M 1/0268 |
| 10,180,701 B2 | 1/2019 | Nakamura et al. | |
| 10,310,551 B2 | 6/2019 | Bae et al. | |
| 10,423,019 B1 | 9/2019 | Song | |
| 10,551,880 B1 | 2/2020 | Ai et al. | |
| 10,601,967 B1 | 3/2020 | Harmon et al. | |
| 2015/0241925 A1* | 8/2015 | Seo | G06F 1/1681 |
| | | | 361/679.27 |
| 2015/0366089 A1* | 12/2015 | Park | H04M 1/022 |
| | | | 361/679.01 |
| 2017/0272559 A1 | 9/2017 | Cavallaro et al. | |
| 2018/0088631 A1* | 3/2018 | Park | H04M 1/0266 |
| 2019/0208649 A1* | 7/2019 | Jeon | G06F 1/1641 |
| 2019/0258301 A1 | 8/2019 | Pereira et al. | |
| 2019/0334114 A1 | 10/2019 | Park | |
| 2019/0346887 A1 | 11/2019 | Park et al. | |
| 2019/0369671 A1 | 12/2019 | Seo et al. | |
| 2019/0380218 A1 | 12/2019 | Moon et al. | |
| 2019/0391615 A1 | 12/2019 | Kee et al. | |
| 2019/0394890 A1 | 12/2019 | Cromer et al. | |
| 2020/0051468 A1 | 2/2020 | Jung et al. | |
| 2020/0076062 A1 | 3/2020 | Lee et al. | |
| 2020/0081499 A1 | 3/2020 | Harmon et al. | |
| 2020/0101708 A1 | 4/2020 | Shin et al. | |
| 2020/0137907 A1 | 4/2020 | Kang et al. | |
| 2020/0163239 A1 | 5/2020 | Yun et al. | |
| 2020/0166974 A1* | 5/2020 | Ai | G06F 1/1681 |
| 2020/0175897 A1 | 6/2020 | Choi | |
| 2021/0263563 A1* | 8/2021 | Tsuchihashi | G06F 1/1681 |

FOREIGN PATENT DOCUMENTS

| | | | |
|---|---|---|---|
| EP | 3 608 751 | | 2/2020 |
| KR | 10-2015-0096827 | | 8/2015 |
| KR | 20150133948 A | * | 12/2015 |
| KR | 10-2016-0083608 | | 7/2016 |
| KR | 10-1801192 | | 12/2017 |
| KR | 10-1820470 | | 1/2018 |
| KR | 10-2019-0080014 | | 7/2019 |
| KR | 10-2019-0124844 | | 11/2019 |
| KR | 10-2085235 | | 3/2020 |
| KR | 10-2020-0037017 | | 4/2020 |
| KR | 10-2020-0047253 | | 5/2020 |
| KR | 10-2020-0058020 | | 5/2020 |
| KR | 10-2110975 | | 6/2020 |
| WO | 2015/190733 | | 12/2015 |

* cited by examiner

DISPLAY DEVICE

CROSS-REFERENCE TO RELATED APPLICATION(S)

This application claims priority to and benefits of Korean Patent Application No. 10-2020-0078744 under 35 U.S.C. § 119, filed on Jun. 26, 2020 in the Korean Intellectual Property Office, the entire contents of which are incorporated herein by reference.

BACKGROUND

(a) Technical Field

The disclosure herein relates to a display device.

(b) Description of the Related Art

An electronic device for providing an image to a user, for example, a smartphone, a digital camera, a laptop computer, a navigation unit, and a smart television, may include a display device for displaying an image. The display device generates an image to provide the generated image to the user through a display screen.

In recent years, as technologies of the display device are developed, various types of display devices have been developed. For example, various flexible display devices that are deformable, foldable, and rollable into a curved shape have been developed. The flexible display devices that are deformable into various shapes may be portable and thus increase user convenience.

A folding display device among the flexible display devices may include a display module folded with respect to a folding axis extending in one direction. The display module may be folded or unfolded with respect to the folding axis. The display module may include a folding area that may be bent during a folding operation. As the folding area is repeatedly folded or unfolded, the folding area may be deformed. Thus, a technology capable of reducing deformation of the folding area is currently in demand.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device capable of reducing deformation of a folding area.

An embodiment provides a display device that may include a display module including a first non-folding area, a second non-folding area, and a folding area disposed between the first non-folding area and the second non-folding area, the first non-folding area, the second non-folding area, and the folding area being arranged in a first direction; a first support disposed below the first non-folding area; a second support disposed below the second non-folding area; and a hinge including a biaxial rotation shaft disposed between the first support and the second support, the biaxial rotation shaft extending in a second direction intersecting the first direction. The folding area may have a curvature radius in a range of about 1.5 mm to about 5.0 mm when the display module is folded by a rotation of the first support and the second support with respect to the biaxial rotation shaft.

In an embodiment, the folding area may have a length in a range of about 35 mm to about 45 mm in the first direction when the display module is unfolded.

In an embodiment, the folding area may include a curved part bent to have the curvature radius when the display module is folded; a first extension part bent from the first non-folding area to extend to the curved part; and a second extension part bent from the second non-folding area to extend to the curved part, wherein a distance between the first non-folding area and the second non-folding area may be less than the curvature radius of the curved part of the folding area when the display module is folded.

In an embodiment, the first extension part and the second extension part may be symmetric when the display module is folded, and the first extension part may form an acute angle with a first reference line extending from the first non-folding area to the curved part in a same direction as an extension direction of the first non-folding area when the display module is folded.

In an embodiment, the acute angle may be in a range of about 6.5° to about 12.5°.

In an embodiment, the display device may further include a first support plate disposed between the first support and the first non-folding area; and a second support plate disposed between the second support and the second non-folding area, wherein the first support plate may extend below the first extension part and the curved part, the second support plate may extend below the second extension part and the curved part, and the first support plate may be spaced apart from the second support plate below the curved part.

In an embodiment, the first support plate and the second support plate may be attached to the first non-folding area, the second non-folding area, the first extension part, and the second extension part, and the first support plate and the second support plate may not be attached to the curved part.

In an embodiment, the first support plate may be bent at a boundary between the first non-folding area and the first extension part when the display module is folded, and the second support plate may be bent at a boundary between the second non-folding area and the second extension part when the display module is folded.

In an embodiment, each of the first support plate and the second support plate may have a thickness in a range of about 80 μm to about 150 μm in a third direction perpendicular to a plane defined by the first and second directions when the display module is unfolded.

In an embodiment, the display device may further include a black coating layer coated on each of a top surface of the first support plate and a top surface of the second support plate; a first cushion layer disposed below the first support plate; and a second cushion layer disposed below the second support plate.

In an embodiment, the first support may extend below the first extension part, the second support may extend below the second extension part, a top surface of the first support facing the first extension part may have a first inclined surface in a plan view, and a top surface of the second support facing the second extension part may have a second inclined surface in the plan view.

In an embodiment, the display device may further include a first wing plate disposed between the first extension part and the first inclined surface of the top surface of the first support and rotatably connected to a portion of the first support, wherein the portion of the first support may overlap a boundary between the first non-folding area and the first extension part in a plan view; and a second wing plate disposed between the second extension part and the second inclined surface of the top surface of the second support and rotatably connected to a portion of the second support, wherein the portion of the second support may overlap a boundary between the second non-folding area and the second extension part in a plan view, wherein the first wing plate and the second wing plate may rotate with respect to a first rotation shaft and a second rotation shaft extending in the second direction.

In an embodiment, the second wing plate may be symmetric to the first wing plate, the second inclined surface of the top surface of the second support may be symmetric to the first inclined surface of the top surface of the first support, a distance between the first wing plate and the first inclined surface of the top surface of the first support may increase in a direction toward the curved part when the display module is unfolded, and the first inclined surface of the top surface of the first support may form an angle in a range of about 6.5° to about 12.5° with the first wing plate when the display module is unfolded.

In an embodiment, the first wing plate may contact the first inclined surface of the top surface of the first support, and the second wing plate may contact the second inclined surface of the top surface of the second support upon a stress of the folding area when the display module is folded.

In an embodiment, the hinge may include a cover part disposed between the first support and the second support and below the first wing plate and the second wing plate; a first rotation unit and a second rotation unit connected to opposite ends of the cover part in the second direction; and a plurality of hinge parts connected to opposite sides of the first support and the second support in the second direction, and the first rotation unit and the second rotation unit, wherein the cover part may include a groove facing the curved part and extending in the second direction, and the biaxial rotation shaft may overlap the curved part and the groove in a plan view.

In an embodiment, a side of the first wing plate and a side of the second wing plate facing each other, and a central portion of the curved part may be disposed in the groove when the display module is folded.

In an embodiment, the first non-folding area may face the second non-folding area when the display module is in-folded.

In an embodiment, a display device may include a display panel including a first non-folding area, a second non-folding area, and a folding area disposed between the first non-folding area and the second non-folding area, the first non-folding area, the second non-folding area, and the folding area being arranged in a first direction; a reflection preventing layer disposed on the display panel; a window disposed on the reflection preventing layer; a window protection layer disposed on the window; a panel protection layer disposed below the display panel; a first support plate disposed below the first non-folding area; and a second support plate disposed below the second non-folding area. The folding area may include a curved part having a predetermined curvature radius when the display panel is folded; a first extension part bent from the first non-folding area extending to the curved part; and a second extension part bent from the second non-folding area extending to the curved part. A distance between the first non-folding area and the second non-folding area may be less than the predetermined curvature radius of the curved part when the display panel is folded.

In an embodiment, the window may have a thickness greater than about 30 µm and equal to or less than about 80 µm, the window protection layer may have a thickness in a range of about 55 µm to about 100 µm, and each of the first support plate and the second support plate may have a thickness in a range of about 80 µm to about 150 µm in a third direction perpendicular to a plane defined by the first direction and the second direction.

In an embodiment, the display device may further include a black coating layer coated on each of a top surface of the first support plate and a top surface of the second support plate; a first adhesive layer disposed between the window protection layer and the window; a second adhesive layer disposed between the window and the reflection preventing layer; a third adhesive layer disposed between the display panel and the panel protection layer; and a fourth adhesive layer disposed between the panel protection layer and the black coating layer.

In an embodiment, a display device may include a display module including a first non-folding area, a second non-folding area, and a folding area disposed between the first non-folding area and the second non-folding area, the first non-folding area, the second non-folding area, and the folding area being arranged in a first direction; a first support disposed below the first non-folding area; and a second support disposed below the second non-folding area. The display module may be folded by rotation of the first support and the second support that rotate with respect to biaxial rotation shafts disposed below the folding area. The folding area may include a curved part bent to have a predetermined curvature radius when the display panel is folded; a first extension part disposed between the first non-folding area and the curved part; and a second extension part disposed between the second non-folding area and the curved part. The folding area may have a length in a range of about 35 mm to about 45 mm in the first direction when the display panel is unfolded, and the first extension part may form an angle in a range of about 6.5° to about 12.5° with a first reference line extending from the first non-folding area to the curved part in a same direction as an extension direction of the non-folding area when the display module is folded.

In an embodiment, the curved part of the folding area may be bent to have a predetermined curvature radius in a range of about 1.5 mm to about 5.0 mm.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
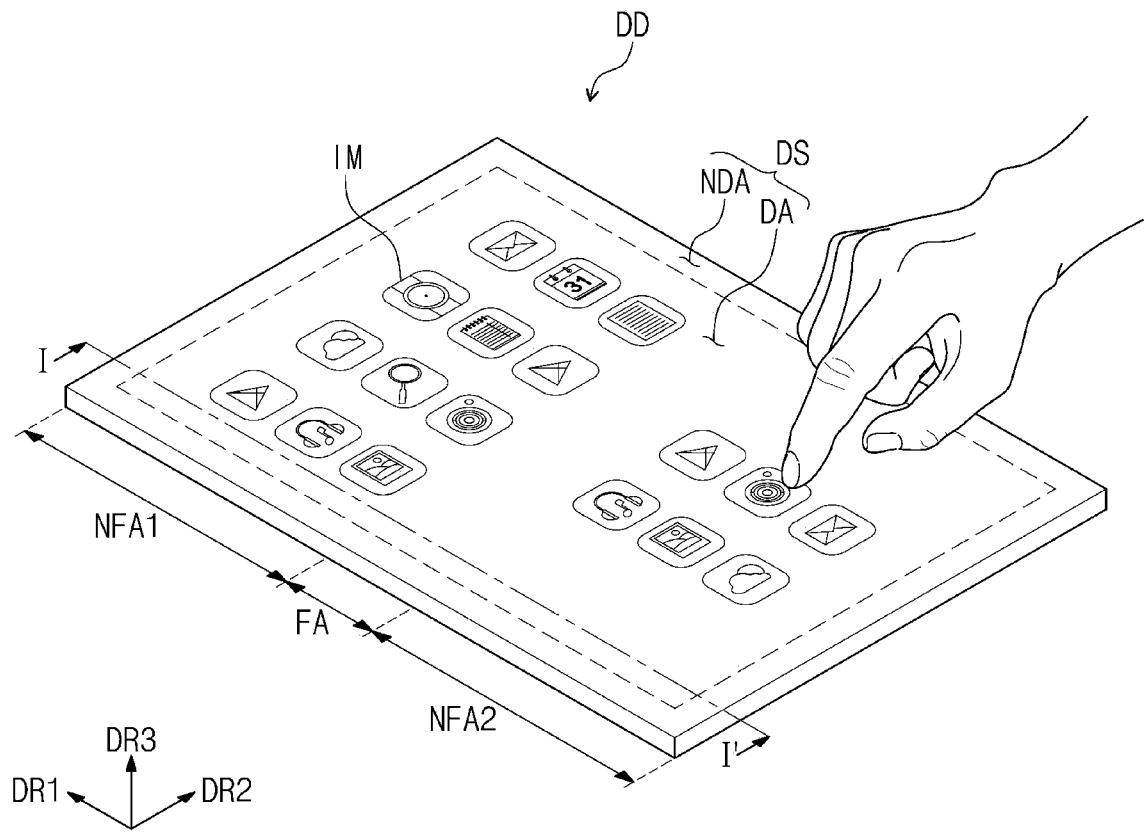
FIG. 1 is a perspective view illustrating a display device according to an embodiment.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

As used herein, the singular forms "a," "an," and "the" are intended to include the plural forms as well, unless the context clearly indicates otherwise.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

As used herein, the term "unit" and/or "module" denotes a structure or element as illustrated in the drawings and as described in the specification. However, the disclosure is not limited thereto. The term "unit" and/or "module" is not to be limited to that which is illustrated in the drawings.

Also, ""under", "below", "above", "upper", and the like are used for explaining relation association of components illustrated in the drawings. The terms may be a relative concept and described based on directions expressed in the drawings but are not limited thereto.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having a formal meaning.

The meaning of 'include', 'includes', 'including' or 'comprise', 'comprises', or 'comprising' or 'has', 'have' or 'having' and their variations specify a property, a fixed number, a step, an operation, an element, a component or a combination thereof, but does not exclude other properties, fixed numbers, steps, operations, elements, components or combinations thereof.

Hereinafter, embodiments will be described in detail with reference to the accompanying drawings.

Figure 2:
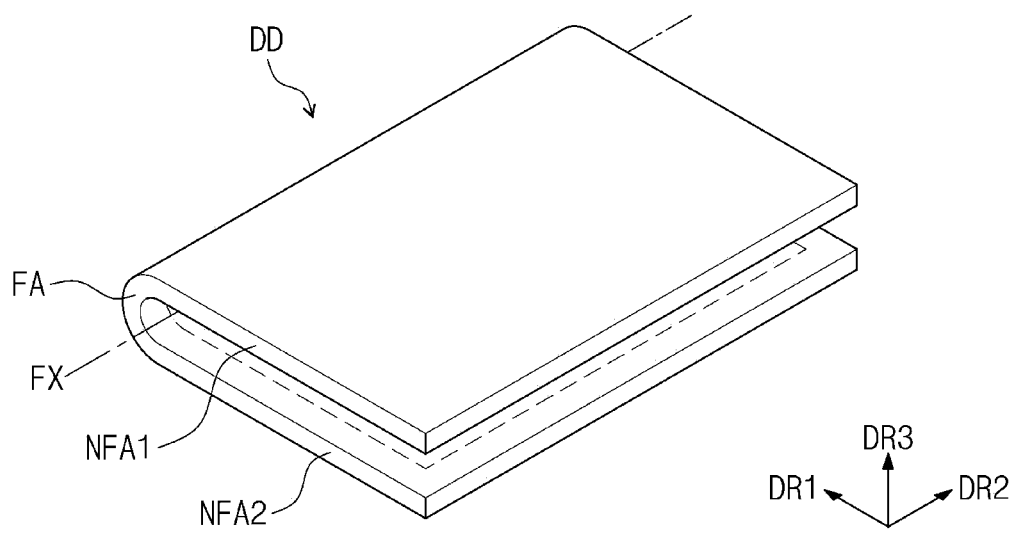
FIG. 2 is a view illustrating a folded state of the display device in FIG. 1.

FIG. 1 is a perspective view illustrating a display device according to an embodiment. FIG. 2 is a view illustrating a folded state of the display device in FIG. 1.

Referring to FIG. 1, a display device DD according to an embodiment may have a substantially rectangular shape having long sides in a first direction DR1 and short sides in a second direction DR2 intersecting the first direction DR1. However, the embodiment is not limited thereto. For example, the display device DD may have various shapes such as a substantially circular shape and a substantially polygonal shape. The display device DD may be a flexible display device.

Hereinafter, a direction that intersects a plane defined by the first and second directions DR1 and DR2 in a substantially perpendicular manner is defined as a third direction DR3. In the specification, an expression "viewed on a plane" may be defined as a state when viewed in the third direction DR3.

The display device DD may include a folding area FA and non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA, the first non-folding area NFA1, and the second non-folding area NFA2 may be arranged in the first direction DR1.

Although a folding area FA and two non-folding areas NFA1 and NFA2 are illustrated, the embodiment is not limited to the number of each of the folding area FA and the non-folding areas NFA1 and NFA2. For example, the display device DD may include two or more non-folding areas and folding areas disposed therebetween.

A top surface of the display device DD may be defined as a display surface DS and have a plane defined by the first direction DR1 and the second direction DR2. Images IM generated in the display device DD may be provided to a user through the display surface DS.

The display surface DS may include a display area DA and a non-display area NDA around the display area DA. The display area DA may display an image, and the non-display area NDA may display no image. The non-display area NDA may define an edge of the display device DD, which may surround or may be adjacent to the display area DA and may be printed in a predetermined color.

Referring to FIG. 2, the display device DD may be a folding-type (foldable) display device that may be folded or unfolded. For example, the display device DD may be folded such that the folding area FA is bent with respect to a folding axis FX parallel to the second direction DR2. The folding axis FX may be defined as a minor axis parallel to the short side of the display device DD.

In a case that the display device DD is folded, the first non-folding area NFA1 and the second non-folding area NFA2 may face each other, and the display device DD may be in-folded so that the display surface DS is not exposed to the outside.

Figure 3:
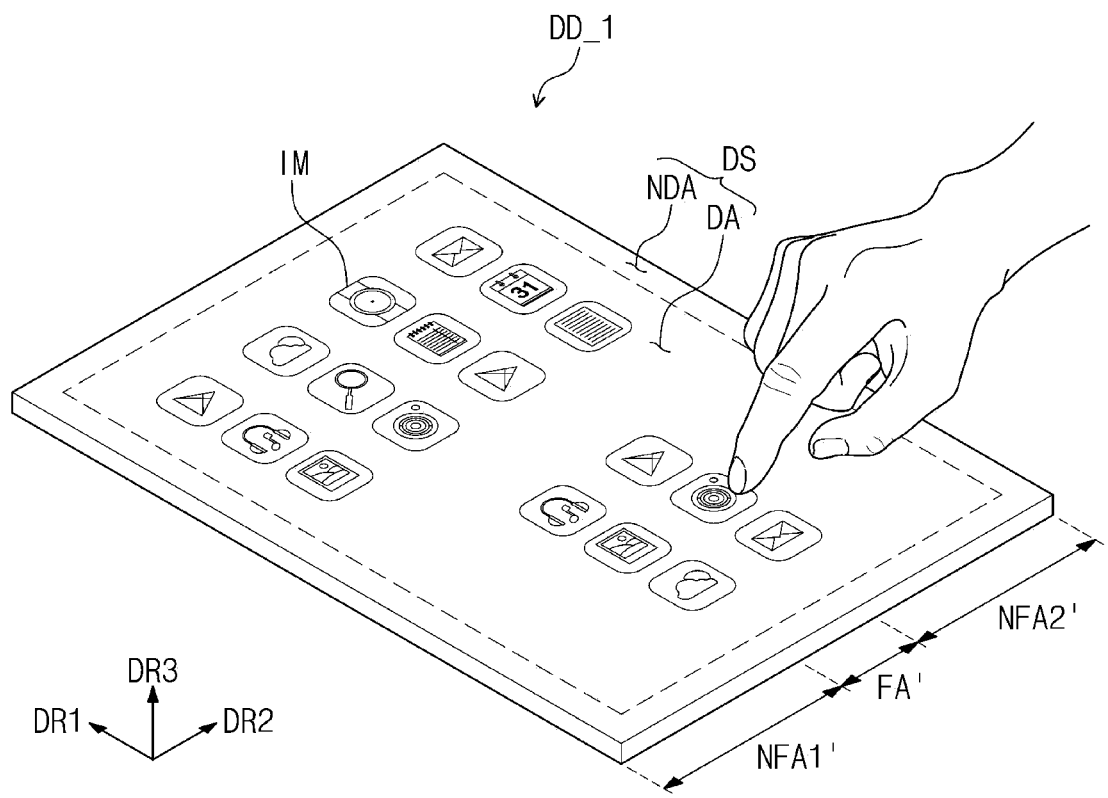
FIG. 3 is a perspective view illustrating a display device according to an embodiment.
Figure 4:
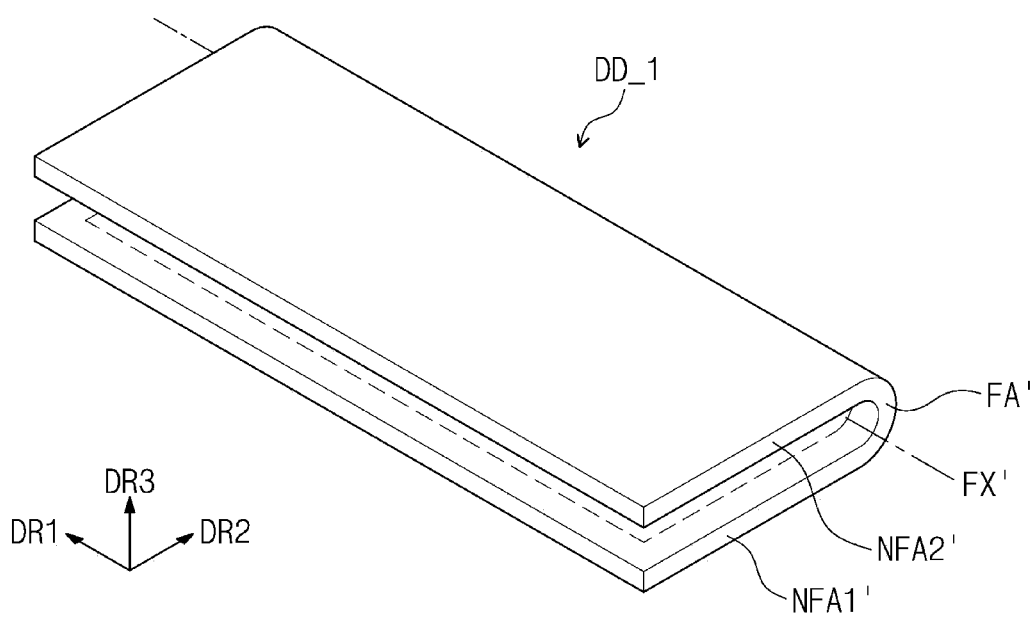
FIG. 4 is a view illustrating a folded state of the display device in FIG. 3.

FIG. 3 is a perspective view illustrating a display device according to an embodiment. FIG. 4 is a view illustrating a folded state of the display device in FIG. 3.

A display device DD_1 in FIG. 3 may have substantially the same configuration as the display device DD in FIG. 1 except for a folding operation. Thus, hereinafter, the folding operation of the display device DD_1 will be mainly described.

Referring to FIGS. 3 and 4, the display device DD_1 may include a folding area FA' and non-folding areas NFA1' and NFA2'. The non-folding areas NFA1' and NFA2' may include a first non-folding area NFA1' and a second non-folding area NFA2'. The folding area FA' may be disposed between the first non-folding area NFA1' and the second non-folding area NFA2'. The folding area FA', the first non-folding area NFA1', and the second non-folding area NFA2' may be arranged in the second direction DR2.

The display device DD_1 may be folded such that the folding area FA' is bent with respect to a folding axis FX' parallel to the first direction DR1. The folding axis FX' may be defined as a major axis parallel to a long side of the display device DD_1. The display device DD in FIG. 1 may be folded with respect to the minor axis, and, in contrast, the display device DD_1 in FIG. 3 may be folded with respect to the major axis. The display device DD_1 may be in-folded so that the display surface DS is not exposed to the outside.

Hereinafter, the display device DD that is in-folded with respect to the folding axis FX parallel to the minor axis will be described.

Figure 5:
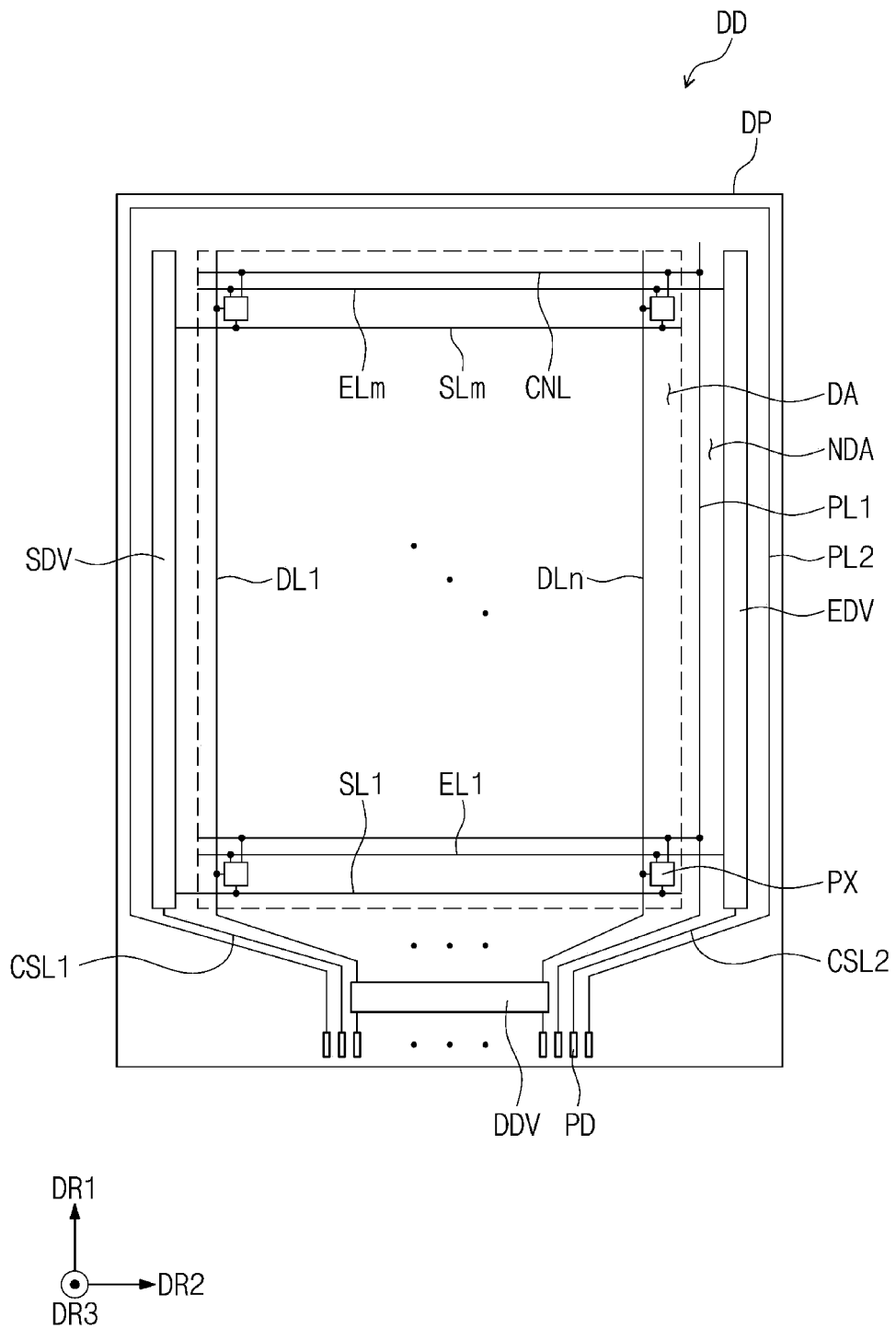
FIG. 5 is a plan view illustrating the display device in FIG. 1.

FIG. 5 is a plan view illustrating the display device DD in FIG. 1.

Referring to FIG. 5, the display device DD may include a display panel DP, a scan driver SDV, a data driver DDV, an emission driver EDV, and pads PD.

The display panel DP may have a substantially rectangular shape having long sides extending in the first direction DR1 and short sides extending in the second direction DR2. However, the embodiment is not limited to the shape of the display panel DP. The display panel DP may include a display area DA and a non-display area NDA surrounding or adjacent to the display area DA.

The display panel DP may include pixels PX, scan lines SL1 to SLm, data lines DL1 to DLn, emission lines EL1 to ELm, first and second control lines CSL1 and CSL2, first and second power lines PL1 and PL2, and connection lines CNL.

Here, m and n are integers.

The pixels PX may be disposed on the display area DA. The scan driver SDV and the emission driver EDV may be disposed on the non-display areas NDA adjacent to the long sides of the display panel DP, respectively. The data driver DDV may be disposed on the non-display area NDA adjacent to one of the short sides of the display panel DP. When viewed in a plan view, the data driver DDV may be disposed adjacent to a lower end of the display panel DP.

The scan lines SL1 to SLm may each extend in the second direction DR2 and may be electrically connected to the pixels PX and the scan driver SDV. The data lines DL1 to DLn may each extend in the first direction DR1 and may be electrically connected to the pixels PX and the data driver DDV. The emission lines EL1 to ELm may each extend in the second direction DR2 and may be electrically connected to the pixels PX and the emission driver EDV.

The first power line PL1 may extend in the first direction DR1 and may be disposed on the non-display area NDA. Although the first power line PL1 may be disposed between the display area DA and the emission driver EDV, the embodiment is not limited thereto. For example, the first power line PL1 may be disposed between the display area DA and the scan driver SDV.

The connection lines CNL may each extend in the second direction DR2 and may be arranged in the first direction DR1. The connection lines CNL may be electrically connected to the first power line PL1 and the pixels PX. A first voltage may be applied to the pixels PX through the first power line PL1 and the connection lines CNL electrically connected to each other.

The second power line PL2 may be disposed on the non-display area NDA. The second power line PL2 may extend along the long sides of the display panel DP, and the other of the short sides of the display panel DP at which the data driver DDV is not disposed. The second power line PL2 may be disposed further than the scan driver SDV and the emission driver EDV.

Although not shown, the second power line PL2 may extend toward the display area DA and may be electrically connected to the pixels PX. A second voltage having a level lower than the first voltage may be applied to the pixels PX through the second power line PL2.

The first control line CSL1 may be electrically connected to the scan driver SDV and may extend toward the lower end of the display panel DP when viewed on the plane. The first control line CSL1 may be electrically connected to the scan driver SDV and may extend toward the lower end of the display panel DP when viewed on the plane. The data driver DDV may be disposed between the first control line CSL1 and the second control line CSL2.

The pads PD may be disposed on the display panel DP. The pads PD may be disposed closer to the lower end of the display panel DP than to the data driver DDV. The data driver DDV, the first power line PL1, the second power line PL2, the first control line CSL1, and the second control line CSL2 may be electrically connected to the pads PD. The data lines DL1 to DLn may be electrically connected to the data driver DDV, and the data driver DDV may be electrically connected to the pads PD corresponding to the data lines DL1 to DLn.

Although not shown, the display device DD may include a timing controller for controlling an operation of each of the scan driver SDV, the data driver DDV, and the emission driver EDV and a voltage generator for generating the first and second voltages. The timing controller and the voltage generator may be electrically connected to corresponding pads PD through a printed circuit board.

The scan driver SDV may generate scan signals, and the scan signals may be applied to the pixels PX through the scan lines SL1 to SLm. The data driver DDV may generate data voltages, and the data voltages may be applied to the pixels PX through the data lines DL1 to DLn. The emission driver EDV may generate emission signals, and the emission signals may be applied to the pixels PX through the emission lines EL1 to ELm.

The pixels PX may receive the data voltages in response to the scan signals. The pixels PX may emit light having luminance corresponding to the data voltages in response to the emission signals to thus display an image. The pixels PX may have an emission time that may be controlled by the emission signals.

Figure 6:
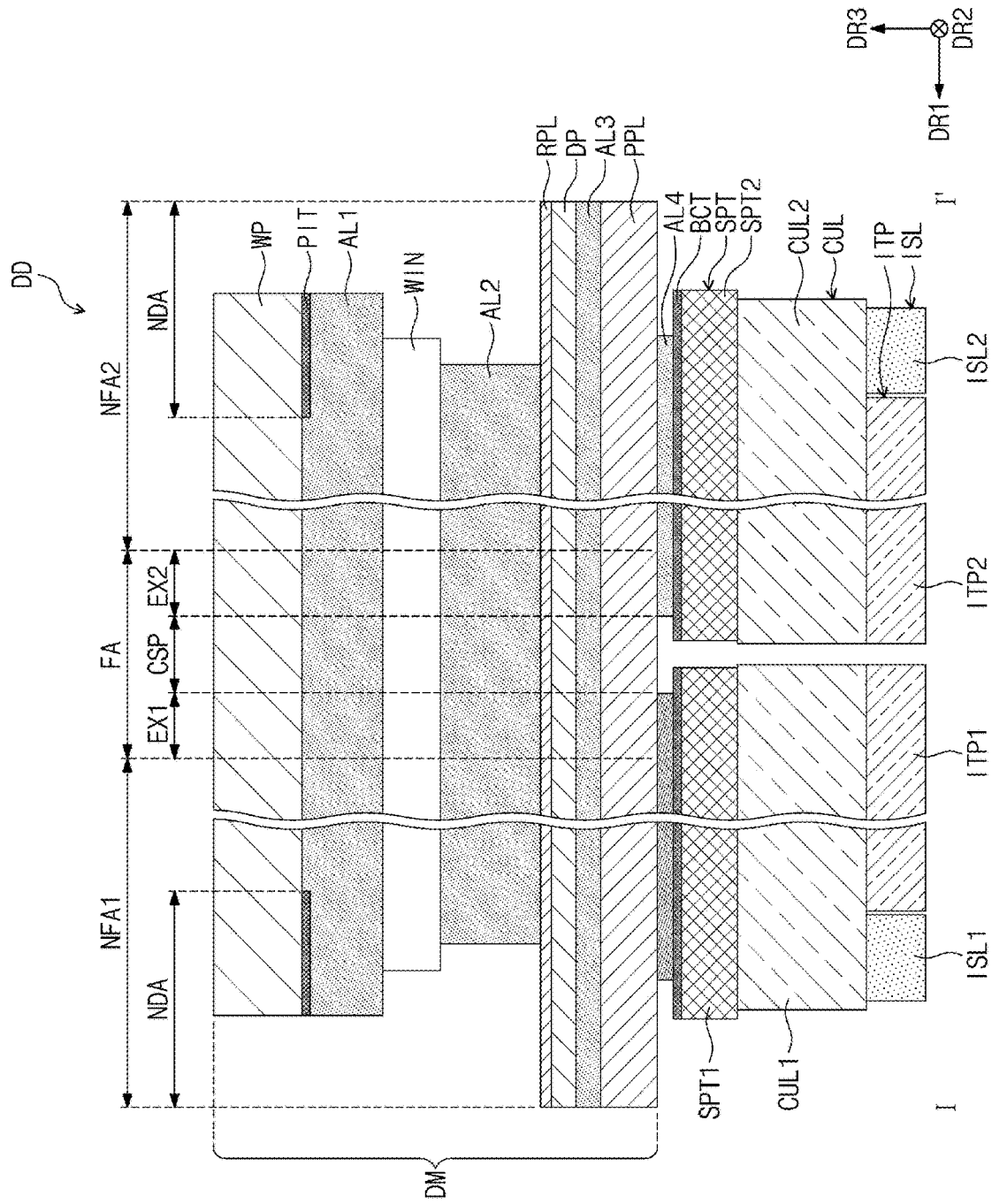
FIG. 6 is a schematic cross-sectional view taken along line I-I' of FIG. 1.

FIG. 6 is a schematic cross-sectional view taken along line I-I' of FIG. 1.

Referring to FIG. 6, the display device DD may include a display module DM, a support plate SPT, a cushion layer CUL, an insulating tape ITP, an impact absorbing layer ISL, and a black coating layer BCT. The display module DM may include the first non-folding area NFA1, the folding area FA, and the second non-folding area NFA2, which are arranged in the first direction DR1, like the display device DD.

The folding area FA may include a curved part CSP, a first extension part EX1 disposed between the curved part CSP and the first non-folding area NFA1, and a second extension part EX2 disposed between the curved part CSP and the second non-folding area NFA2. Further detailed shapes of the curved part CSP, the first non-folding area NFA1, and the second non-folding area NFA2 will be described below.

The support plate SPT may be disposed below the display module DM. The support plate SPT may include a metal material such as stainless steel. Although the support plate SPT may include STS316 as an example, the embodiment is not limited thereto. For example, the support plate SPT may include various metal materials. The support plate SPT may support the display module DM. In addition, the support plate SPT may increase the heat dissipation performance of the display device DD.

The support plate SPT may include a first support plate SPT1 disposed below the first non-folding area NFA1 and a second support plate SPT2 disposed below the second non-folding area NFA2. The first support plate SPT1 and the second support plate SPT2 may each extend below the folding area FA and may be spaced apart from each other.

The first support plate SPT1 may extend below the first extension part EX1 and the curved part CSP. The second support plate SPT2 may extend below the second extension part EX2 and the curved part CSP. The first support plate SPT1 and the second support plate SPT2 may be spaced apart from each other below the curved part CSP.

The cushion layer CUL may be disposed below the support plate SPT. The cushion layer CUL may absorb an external impact applied to a lower portion of the display module DM to protect the display module DM. The cushion layer CUL may include a foam sheet having a predetermined elastic force. The cushion layer CUL may include foam, sponge, polyurethane, or thermoplastic polyurethane.

The cushion layer CUL may include a first cushion layer CUL1 disposed below the first support plate SPT1 and a second cushion layer CUL2 disposed below the second support plate SPT2. The first cushion layer CUL1 and the second cushion layer CUL2 may each extend below the folding area FA and may be spaced apart from each other.

The insulating tape ITP may be disposed below the cushion layer CUL. The insulating tape ITP may include an insulating material. The insulating tape ITP may include a first insulating tape ITP1 disposed below the first cushion layer CUL1 and a second insulating tape ITP2 disposed below the second cushion layer CUL2. The first insulating tape ITP1 and the second insulating tape ITP2 may each extend below the folding area FA and may be spaced apart from each other.

The impact absorbing layer ISL may be disposed below the cushion layer CUL. The impact absorbing layer ISL may be disposed adjacent to an edge of the cushion layer CUL. The impact absorbing layer ISL may be disposed further than the insulating tape ITP. The impact absorbing layer ISL may absorb an external impact applied to the edge of the display device DD. The impact absorbing layer ISL may include a pressure sensitive adhesive (PSA).

The impact absorbing layer ISL may include a first impact absorbing layer ISL1 disposed below the first cushion layer CUL1 and a second impact absorbing layer ISL2 disposed below the second cushion layer CUL2. The first impact absorbing layer ISL1 may be disposed further than the first insulating tape ITP1. The second impact absorbing layer ISL2 may be disposed further than the second insulating tape ITP2. Thus, the first and second insulating tapes ITP1 and ITP2 may be disposed between the first impact absorbing layer ISL1 and the second impact absorbing layer ISL2.

The black coating layer BCT may be disposed between the display module DM and the support plate SPT. The black coating layer BCT may be coated on each of a top surface of the first support plate SPT1 and a top surface of the second support plate SPT2. The black coating layer BCT may include a black material. The black coating layer BCT may prevent structures disposed therebelow from being seen from above.

The display module DM may include the display panel DP, a reflection preventing layer RPL, a window WIN, a window protection layer WP, a panel protection layer PPL, and a printed layer PIT. The display panel DP according to an embodiment may be a light emitting display panel. For example, the display panel DP may be an organic light emitting display panel or a quantum dot light emitting display panel. The organic light emitting display panel may include a light emitting layer containing an organic light emitting material. The quantum dot light emitting display panel may include a light emitting layer containing a quantum dot or a quantum rod. Hereinafter, the display panel DP will be described as the organic light emitting display panel.

The display panel DP may be a flexible display panel. The display panel DP may include a first non-folding area NFA1, a folding area FA, and a second non-folding area NFA2, which are arranged in the first direction DR1, like the display module DM. Also, the folding area FA of the display panel DP may include a curved part CSP, a first extension part EX1, and a second extension part EX2 like the display module DM. The display panel DP may include pixels for displaying an image. The pixels may include organic light emitting elements.

The reflection preventing layer RPL may be disposed on the display panel DP. The reflection preventing layer RPL may be disposed directly on the display panel DP. However, the embodiment is not limited thereto. For example, the reflection preventing layer RPL may be manufactured as a separate panel and attached to the display panel DP by using an adhesive.

The reflection preventing layer RPL may be defined as an external light reflection preventing film. The reflection preventing layer RPL may reduce a reflectance of external light incident to the display panel DP from above the display device DD.

In a case that the external light incident to the display panel DP is reflected by the display panel DP and redirected to an external user, the user may recognize the external light. To prevent the above-described phenomenon, the reflection preventing layer RPL may include color filters displaying the same color as the pixels.

The color filters may filter out external light to display the same color as the pixels. The external light may not be recognized by the user. However, the embodiment is not limited thereto. For example, the reflection preventing layer RPL may include a phase retarder and/or a polarizer.

The window WIN may be disposed on the reflection preventing layer RPL. The window WIN may protect the display panel DP and the reflection preventing layer RPL from external scratches. The window WIN may be optically transparent. The window WM may include glass. The window WIN may be defined as an ultra-thin glass (UTG). However, the embodiment is not limited thereto. For example, the window WIN may include a synthetic resin film.

The window protection layer WP may be disposed on the window WIN. The window protection layer WP may protect the window WIN. The window protection layer WP may include a flexible plastic material such as polyimide (PI) or polyethylene terephthalate (PET). Although not shown, a hard coating layer may be provided on the window protection layer WP. In addition, an anti-fingerprint layer or an anti-scattering layer, which is defined as a functional layer, may be provided on the window protection layer WP.

The panel protection layer PPL may be disposed below the display panel DP. The panel protection layer PPL may protect a lower portion of the display panel DP. The panel protection layer PPL may include a flexible plastic material. For example, the panel protection layer PPL may include polyethylene terephthalate (PET).

The display device DD may include first to fourth adhesive layers AL1 to AL4. The first adhesive layer AL1 may be disposed between the window protection layer WP and the window WIN. The second adhesive layer AL2 may be disposed between the window WIN and the reflection preventing layer RPL. The third adhesive layer AL3 may be disposed between the display panel DP and the panel protection layer PPL.

The fourth adhesive layer AL4 may be disposed between the panel protection layer PPL and the support plate SPT. In detail, the fourth adhesive layer AL4 may be disposed between the panel protection layer PPL and the black coating layer BCT.

Each of the first to fourth adhesive layers AL1 to AL4 may include a transparent adhesive such as a pressure sensitive adhesive (PSA) or an optically clear adhesive (OCA).

The window protection layer WP and the window WIN may be attached to each other by the first adhesive layer AL1. The window WIN and the reflection preventing layer RPL may be attached to each other by the second adhesive layer AL2. The display panel DP and the panel protection layer PPL may be attached to each other by the third adhesive layer AL3.

The panel protection layer PPL and the support plate SPT may be attached to each other by the fourth adhesive layer AL4. In detail, the panel protection layer PPL may be attached to the black coating layer BCT by the fourth adhesive layer AL4.

The printed layer PIT may be disposed on a bottom surface of the window protection layer WP. The printed layer PIT may overlap the non-display area NDA when viewed on the plane. The first adhesive layer AL1 may be disposed below the window protection layer WP to cover or overlap the printed layer PIT. Although the printed layer PIT may have a black color as an example, the embodiment is not limited thereto. For example, the printed layer PIT may have various colors.

When viewed on the plane, the fourth adhesive layer AL4 may overlap the first and second non-folding areas NFA1 and NFA2. In addition, when viewed on the plane, the fourth adhesive layer AL4 may overlap the first and second extension parts EX1 and EX2 and may not overlap the curved part CSP. Thus, the first and second support plates SPT1 and SPT2 may be attached to the first and second non-folding areas NFA1 and NFA2 and the first and second extension parts EX1 and EX2 and may not be attached to the curved part CSP.

In the third direction DR3, the reflection preventing layer RPL may have a thickness less than that of the display panel DP, the window WIN may have a thickness greater than that of the display panel DP, and the window protection layer WP may have a thickness greater than that of the window WIN. In the third direction DR3, the first adhesive layer AL1 may have the same thickness as that of the second adhesive layer AL2. In addition, each of the first adhesive layer AL1 and the second adhesive layer AL2 may have a thickness greater than that of the window WIN and less than that of the window protection layer WP.

In the third direction DR3, the panel protection layer PPL may have the same thickness as that of the window WIN, and the third adhesive layer AL3 may have a thickness less than that of the display panel DP and greater than that of the reflection preventing layer RPL. In the third direction DR3, the fourth adhesive layer AL4 may have a thickness less than that of the third adhesive layer AL3 and greater than that of the reflection preventing layer RPL.

In the third direction DR3, the window WIN may have a thickness greater than about 30 µm and less than about or equal to 80 µm, and the window protection layer WP may have a thickness in a range from about 55 µm to about 100 µm. In the third direction DR3, the support plate SPT may have a thickness in a range from about 80 µm to about 150 µm In the third direction DR3, the support plate SPT may have a thickness greater than that of the window WIN. In the third direction DR3, the cushion layer CUL may have a thickness equal to or greater than that of the support plate SPT. In the third direction DR3, each of the insulating tape ITP and the impact absorbing layer ISL may have the same thickness as that of the panel protection layer PPL.

In the first direction DR1 and the second direction DR2, the window protection layer WP may have a width greater than that of the window WIN. In the first direction DR1 and the second direction DR2, each of the display panel DP, the reflection preventing layer RPL, and the panel protection layer PPL may have a width greater than that of the window protection layer WP.

In the first direction DR1 and the second direction DR2, the display panel DP, the reflection preventing layer RPL, and the panel protection layer PPL may have the same width as each other. In the first direction DR1 and the second direction DR2, the first adhesive layer AL1 may have the same width as that of the window protection layer WP, and the second adhesive layer AL2 may have a width less than that of the window WIN.

Since the window WIN and the second adhesive layer AL2 between the window protection layer WP and the display panel DP have different widths, the difference in width therebetween may form a stepped structure therebetween. The window protection layer WP may have a thickness sufficient to prevent the stepped structure from being recognized from the outside. For example, in a case that the window protection layer WP has a thickness in a range from about 55 µm to about 100 µm, the stepped structure may not be recognized from the outside.

When viewed on the plane, each of the first and second support plates SPT1 and SPT2, the first and second cushion layers CUL1 and CUL2, the first and second insulating tapes ITP1 and ITP2, and the first and second impact absorbing layers ISL1 and ISL2 may be disposed at an inner side more than the edge of the display panel DP.

Figure 7:
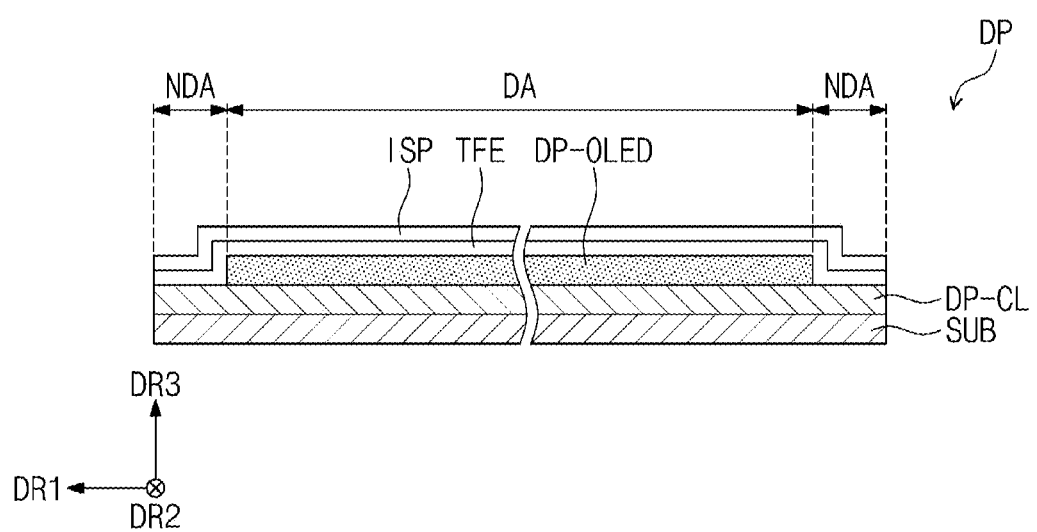
FIG. 7 is a schematic cross-sectional view exemplarily illustrating a display panel in FIG. 6.

FIG. 7 is a schematic cross-sectional view illustrating the display panel DP in FIG. 6.

Referring to FIG. 7, the display panel DP may include a substrate SUB, a circuit element layer DP-CL disposed on the substrate SUB, a display element layer DP-OLED disposed on the circuit element layer DP-CL, a thin-film encapsulation layer TFE disposed on the display element layer DP-OLED, and an input sensing part ISP disposed on the thin-film encapsulation layer TFE.

The substrate SUB may include a display area DA and a non-display area NDA around the display area DA. The substrate SUB may include a flexible plastic material. For example, the substrate SUB may include polyimide (PI). The display element layer DP-OLED may be disposed on the display area DA.

The circuit element layer DP-CL may include an insulation layer, a semiconductor pattern, a conductive pattern, and a signal line. Each of the insulation layer, the semiconductor layer, and the conductive layer may be provided on the substrate SUB through coating, deposition, and the like within the spirit and the scope of the disclosure. Thereafter, the insulation layer, the semiconductor layer, and the conductive layer may be selectively patterned through photolithography processes to provide the semiconductor pattern, the conductive pattern, and the signal line.

The circuit element layer DP-CL may include transistors constituted by the semiconductor pattern, the conductive pattern, and the signal line. The display element layer DP-OLED may include light emitting elements electrically connected to the transistors. The pixels PX may include the transistors and the light emitting elements.

The thin-film encapsulation layer TFE may be disposed on the circuit element layer DP-CL to cover or overlap the display element layer DP-OLED. The thin-film encapsulation layer TFE may include an inorganic layer, an organic layer, and an inorganic layer, which are sequentially laminated with each other. The inorganic layers may contain an inorganic material and protect the pixels PX from moisture or oxygen. The organic layer may contain an organic material and protect the pixels PX from foreign substances such as dust particles.

The input sensing part ISP may include sensors (not shown) for sensing an external input. The sensors may sense the external input by a capacitive method. The external input may include various types of inputs using a portion of a user's body, light, heat, a pen, or pressure.

The input sensing part ISP may be manufactured on the thin-film encapsulation layer TFE in a case that the display panel DP is manufactured. However, the embodiment is not limited thereto. For example, the input sensing part ISP may be manufactured on a panel distinct from the display panel DP and then attached to the display panel DP by an adhesive layer.

Figure 8:
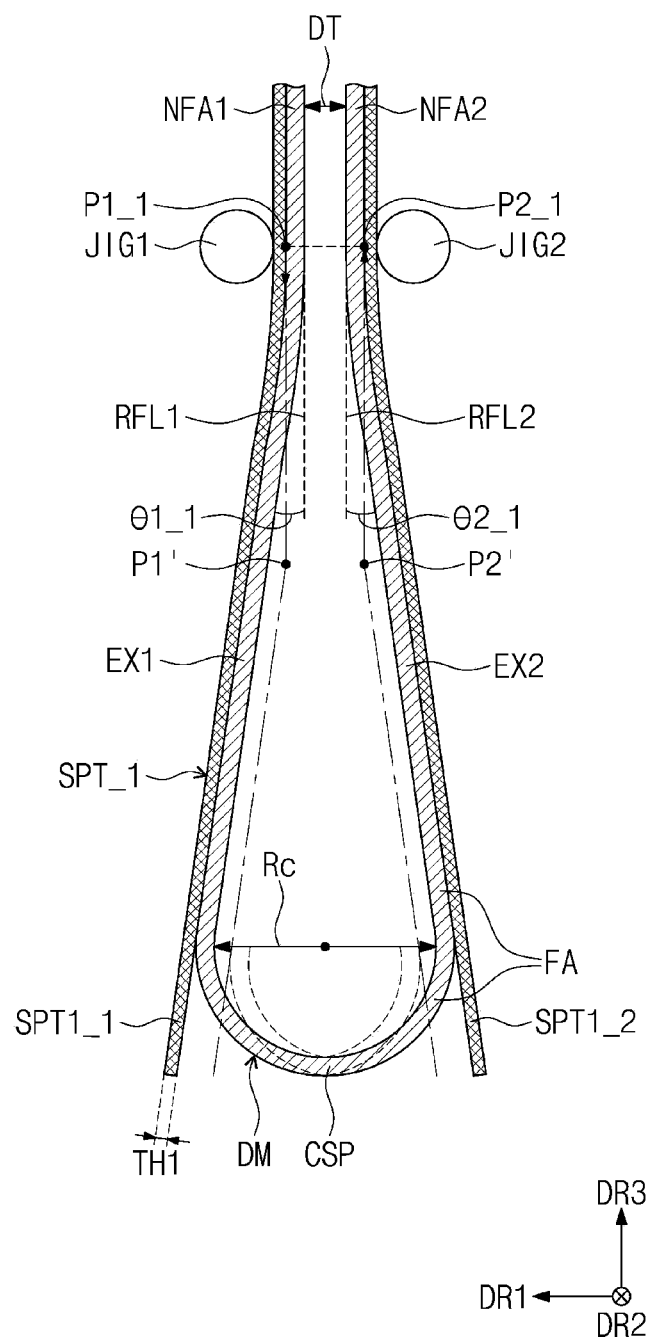
FIGS. 8 to 10 are views illustrating various bent states of the display module and support plates.
Figure 9:
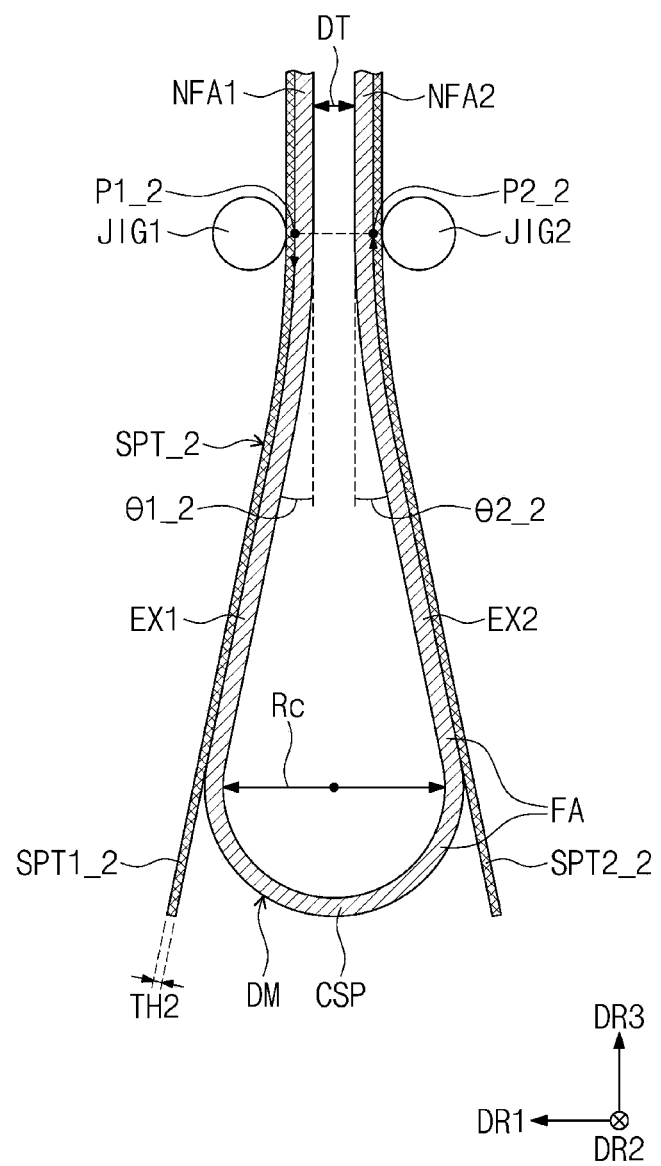
Figure 10:
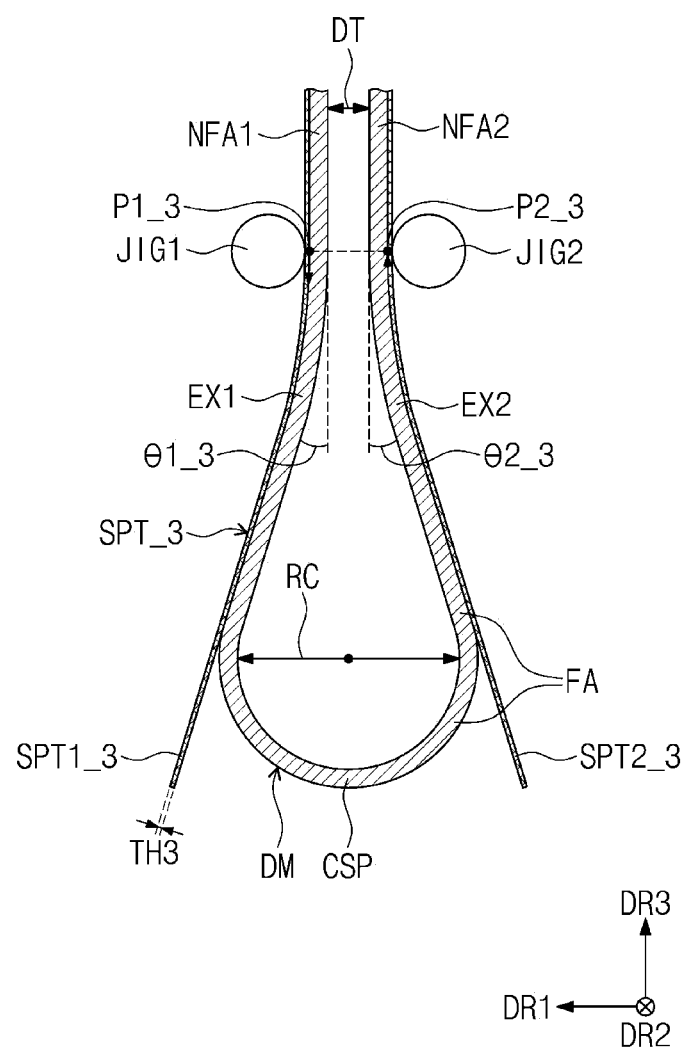

FIGS. 8 to 10 are views illustrating various bent states of the display module and the support plates.

FIGS. 8 to 10 show results obtained by performing tests for the curved part CSP of the display module DM to have a specific or predetermined curvature.

For example, the display module DM and support plates SPT_1 to SPT_3 for supporting the display module DM are illustrated in FIGS. 8 to 10. The support plates SPT_1 to SPT_3 may have the same configuration as the support plate SPT in FIG. 6. However, the support plates SPT_1 to SPT_3 may have different thicknesses.

The cushion layer CUL, the insulating tape ITP, and the impact absorbing layer ISL, which are disposed below the support plates SPT_1 to SPT_3, are omitted for convenience of description. In addition, the black coating layer BCT disposed on the support plates SPT_1 to SPT_3 is omitted.

Referring to FIGS. 8 to 10, jigs JIG1 and JIG2 may be used to fold the display module DM. Each of the support plates SPT_1 to SPT_3 may have a thickness in a range from about 80 µm to about 150 µm like the support plate SPT. The support plates SPT_1 to SPT_3 may have different thicknesses.

The support plate SPT_1 in FIG. 8 may have a first thickness TH1 greater than a second thickness TH2 of the support plate SPT_2 in FIG. 9. The second thickness TH2 of the support plate SPT_2 in FIG. 9 may be greater than a third thickness TH3 of the support plate SPT_3 in FIG. 10.

Each of a length of the folding area FA and lengths of the first and second non-folding areas NFA1 and NFA2 may be varied according to positions of the jigs JIG1 and JIG2 contacting the display module DM.

Hereinafter, a virtual line extending toward the curved part CSP from the first non-folding area NFA1 in the same direction (e.g. third direction DR3) as an extension direction of the first non-folding area NFA1 when the display module DM may be folded may be defined as a first reference line RFL1. In addition, a virtual line extending toward the curved part CSP from the second non-folding area NFA2 in the same direction (e.g. third direction DR3) as an extension direction of the second non-folding area NFA2 when the display module DM may be folded may be defined as a second reference line RFL2.

Hereinafter, bent points between the first extension part EX1 and the first non-folding area NFA1 may be defined as first points P1_1, P1_2, and P1_3. In addition, bent points between the second extension part EX2 and the second non-folding area NFA2 may be defined as second points P21, P2_2, and P2_3.

Referring to FIG. 8, as the display module DM is folded by using the jigs JIG1 and JIG2, the folding area FA may be bent. The jigs JIG1 and JIG2 may include a first jig JIG1 and a second jig JIG2. The first jig JIG1 may be disposed at a boundary between the folding area FA and the first non-folding area NFA1, and the second jig JIG2 may be disposed at a boundary between the folding area FA and the second non-folding area NFA2.

As the first and second jigs JIG1 and JIG2 move to be adjacent to each other, the first non-folding area NFA1 and the second non-folding area NFA2 may be adjacent to each other. In a case that the display module DM is folded, the first and second non-folding area NFA1 and NFA2 may each extend in the third direction DR3.

In a case that the display module DM is folded, the folding area FA may include the bent curved part CSP, the first extension part EX1 disposed between the curved part CSP and the first non-folding area NFA1, and the second extension part EX2 disposed between the curved part CSP and the second non-folding area NFA2.

The curved part CSP may be bent to have a predetermined curvature. In detail, in a case that the display module DM is folded, the curved part CSP may be bent to have a predetermined radius Rc of curvature (hereinafter, referred to as a predetermined curvature radius Rc).

The first extension part EX1 may be bent from the first non-folding area NFA1 by the first jig JIG1 and may extend to the curved part CSP. The second extension part EX2 may be bent from the second non-folding area NFA2 by the second jig JIG2 and may extend to the curved part CSP.

A distance DT between the first non-folding area NFA1 and the second non-folding area NFA2 may be less than the curvature radius Rc. By the above-described structure, the display module DM may be folded into a substantially dumbbell shape.

The support plate SPT_1 may include a first support plate SPT1_1 disposed on the first extension part EX1 and a second support plate SPT2_1 disposed on the second extension part EX2.

In a case that the display module DM is folded, the first support plate SPT1_1 may be bent at the first point P1_1 by the first jig JIG1. The first support plate SPT1_1 may be bent at a boundary between the folding area FA and the first non-folding area NFA1 by the first jig JIG1.

In a case that the display module DM is folded, the second support plate SPT2_1 may be bent at the second point P2_1 by the second jig JIG2. The second support plate SPT2_1 may be bent at a boundary between the folding area FA and the second non-folding area NFA2 by the second jig JIG2.

Since the first support plate SPT1_1 is attached to the first extension part EX1 by the fourth adhesive layer AL4 in FIG. 6, the first extension part EX1 may maintain a flat state by the first support plate SPT1_1. Since the second support plate SPT2_1 is attached to the second extension part EX2 by the fourth adhesive layer AL4 in FIG. 6, the second extension part EX2 may maintain a flat state by the second support plate SPT2_1.

As previously described in FIG. 6, the curved part CSP may not be attached to the first and second support plates SPT1_1 and SPT2_1. Thus, the curved part CSP may be bent in a case that the display module DM is folded.

The first extension part EX1 may make a first angle $\theta1\_1$ with the first reference line RFL1. The second extension part EX2 may make a second angle $\theta2\_1$ with the second reference line RFL2. Each of the first angle $\theta11$ and the second angle $\theta2\_1$ may be an acute angle. In a case that the display module DM is folded, the first extension part EX1 and the second extension part EX2 may extend to be symmetric to each other. Thus, the first angle $\theta1\_1$ may be equal to the second angle $\theta2\_1$. However, an embodiment is not limited thereto. For example, the first angle $\theta1\_1$ may be different from the second angle $\theta2\_1$.

The curved part CSP may be bent to have a desired or predetermined curvature radius RC according to a bent angle of the support plate SPT_1. The bent angle of the support plate SPT_1 may be the first angle $\theta1\_1$ and the second angle $\theta21$ and may be varied according to the thickness TH1 of the support plate SPT_1.

In a case that the display module DM is folded, a stress generated in the folding area FA may push the support plate SPT_1 to the outside. However, the support plate SPT_1 having a greater thickness may have a high resistance against the stress generated in the folding area FA.

A bent point of the support plate SPT_1 may be transferred from the first and second points P1_1 and P2_1 to first and second points P1' and P2', which may be closer to the curved part CSP, in FIG. 8. The curved part CSP may be bent to have a large or great curvature as illustrated by a dotted line by the resistance according to the thickness TH1 of the support plate SPT_1 illustrated by a dash-dotted line, thereby having a curvature radius less than the curvature radius Rc. The curved part CSP may not be bent at the desired or predetermined curvature.

A distance between the first point P1_1 and the second point P2_1 may be defined as that from the first point P1_1 to the second point P2_1 along the display module DM. The distance between the first point P1_1 and the second point P2_1 may be defined as a length of the folding area FA in a case that the folding area FA is unfolded. A distance between the first point P1' and the second point P2' may be defined as a distance from the first point P1' to the second point P2' along the display module DM.

The distance between the first point P1_1 and the second point P2_1 may be less than that between the first point P1' and the second point P2'. The curvature radius Rc of the curved part CSP may be varied according to distances between the bent points P1_1, P2_1, P1', and P2' of the support plate SPT_1.

In summary, the curvature radius Rc of the curved part CSP may be varied according to the bent angle $\theta1\_1$ and $\theta2\_1$ of the support plate SPT_1, the thickness TH1 of the support plate SPT_1, and the distance between the bent points P1_1 and P2_1 of the support plate SPT_1.

Hereinafter, in FIGS. 9 and 10, different components from those of FIG. 8 and a structure of each of the support plates SPT_2 and SPT_3 having the curvature radius Rc will be mainly described.

Referring to FIG. 9, the support plate SPT_2 may include a first support plate SPT1_2 and a second support plate SPT2_2. The support plate SPT_2 may have a second thickness TH2 less than the first thickness TH1. Since the support plate SPT_2 may have a smaller thickness, the support plate SPT_2 may have a resistance less than that of the support plate SPT_1 in FIG. 8 against the stress generated in the folding area FA.

The first support plate SPT1_2 and the second support plate SPT2_2 may be bent at the first point P1_2 and the second point P2_2, respectively, which may be closer to the curved part CSP than to the first point P1_1 and the second point P2_1 in FIG. 8 so that the curved part CSP has the curvature radius Rc.

A distance between the first point P1_2 and the second point P2_2 may be defined as that from the first point P1_2 to the second point P2_2 along the display module DM. The distance between the first point P1_2 and the second point P2_2 may be less than that between the first point P1_1 and the second point P2_1. Thus, a first angle θ1_2 and a second angle θ2_2 may be greater than the first angle θ1_1 and the second angle θ2_1 in FIG. 8, respectively.

Referring to FIG. 10, the support plate SPT_3 may include a first support plate SPT1_3 and a second support plate SPT2_3. The support plate SPT_3 may have a third thickness TH3 less than the second thickness TH2. Since the support plate SPT_3 may have a smaller thickness, the support plate SPT_3 may have a resistance less than that of the support plate SPT_2 in FIG. 9 against the stress generated in the folding area FA.

The first support plate SPT1_3 and the second support plate SPT2_3 may be bent at the first point P1_3 and the second point P2_3, respectively, which may be closer to the curved part CSP than to the first point P1_2 and the second point P2_2 in FIG. 9 so that the curved part CSP has the curvature radius Rc.

A distance between the first point P1_3 and the second point P2_3 may be defined as that from the first point P1_3 to the second point P2_3 along the display module DM. The distance between the first point P1_3 and the second point P2_3 may be less than that between the first point P1_2 and the second point P2_2. Thus, a first angle θ1_3 and a second angle θ2_3 may be greater than the first angle θ1_2 and the second angle θ22 in FIG. 9, respectively.

Referring to FIGS. 8, 9, and 10, the curvature radius Rc of the curved part CSP may be set to a range of about 1.5 mm to about 5.0 mm, as an example, about 2.5 mm. The distance between the first points P1_1, P1_2, and P1_3 and the second points P21, P2_2, and P2_3 may be set to a range of about 35 mm to about 45 mm, as an example about 40 mm. The distance between the first points P1_1, P1_2, and P1_3 and the second points P21, P2_2 and P2_3 may be substantially defined as the length of the folding area FA.

The first angles θ1_1, θ1_2, and θ1_3 may be set to a range of about 6.5° to about 12.5°, as an example about 9.5°, so that the curved part CSP has the curvature radius Rc. The second angles θ2_1, θ2_2, and θ2_3 may be about equal to the first angles θ1_1, θ1_2, and θ1_3, respectively. The thicknesses TH1, TH2, and TH3 of the support plates SPT_1, SPT_2, and SPT_3 may be set to a range of about 80 μm to about 150 μm, as an example about 80 μm, so that the curved part CSP has the curvature radius Rc. Effects caused by the above numerical values will be described in detail below.

Figure 11:
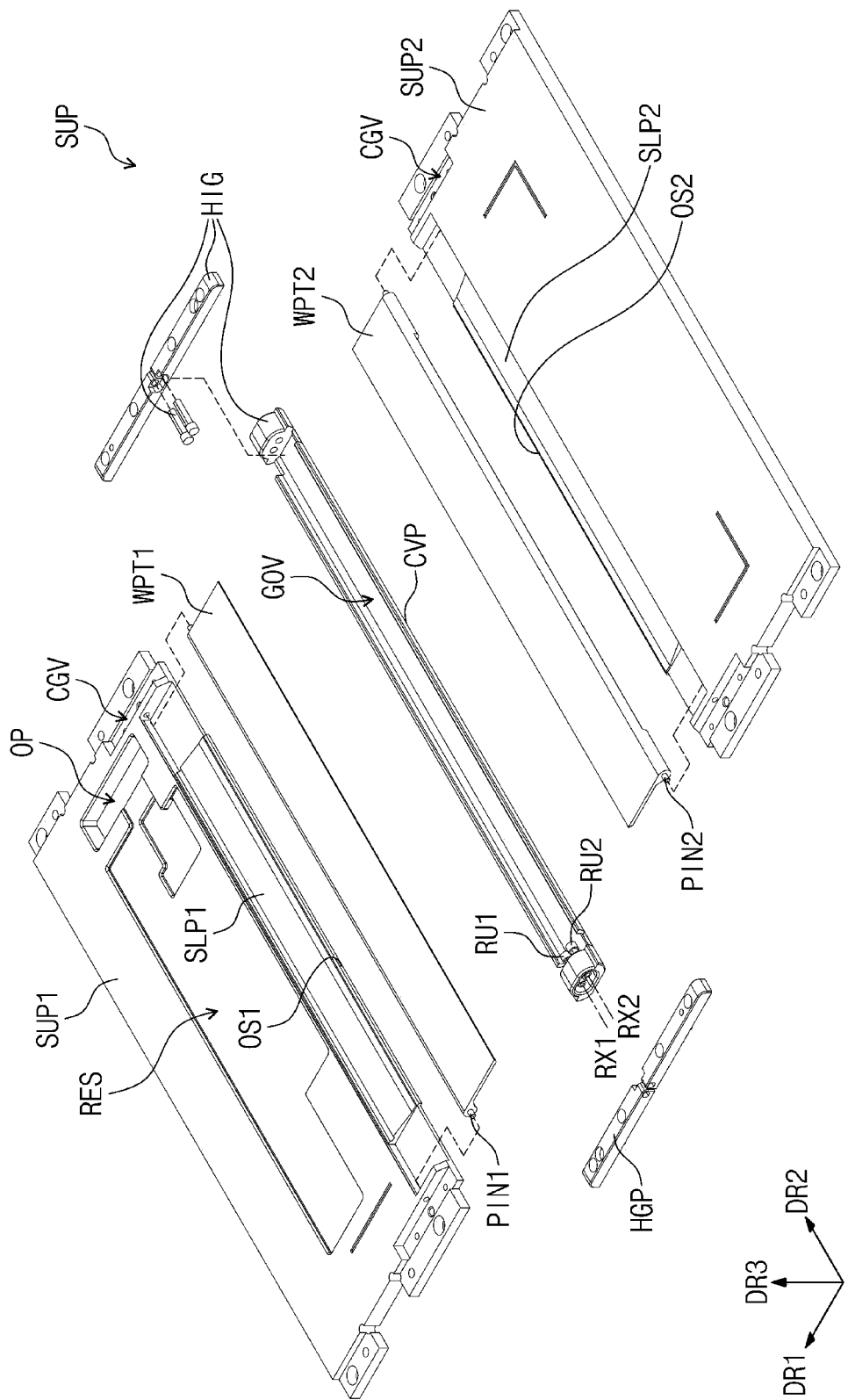
FIGS. 11 and 12 are exploded perspective views illustrating a support on which the display module and the support plate in FIG. 6 are disposed.
Figure 12:
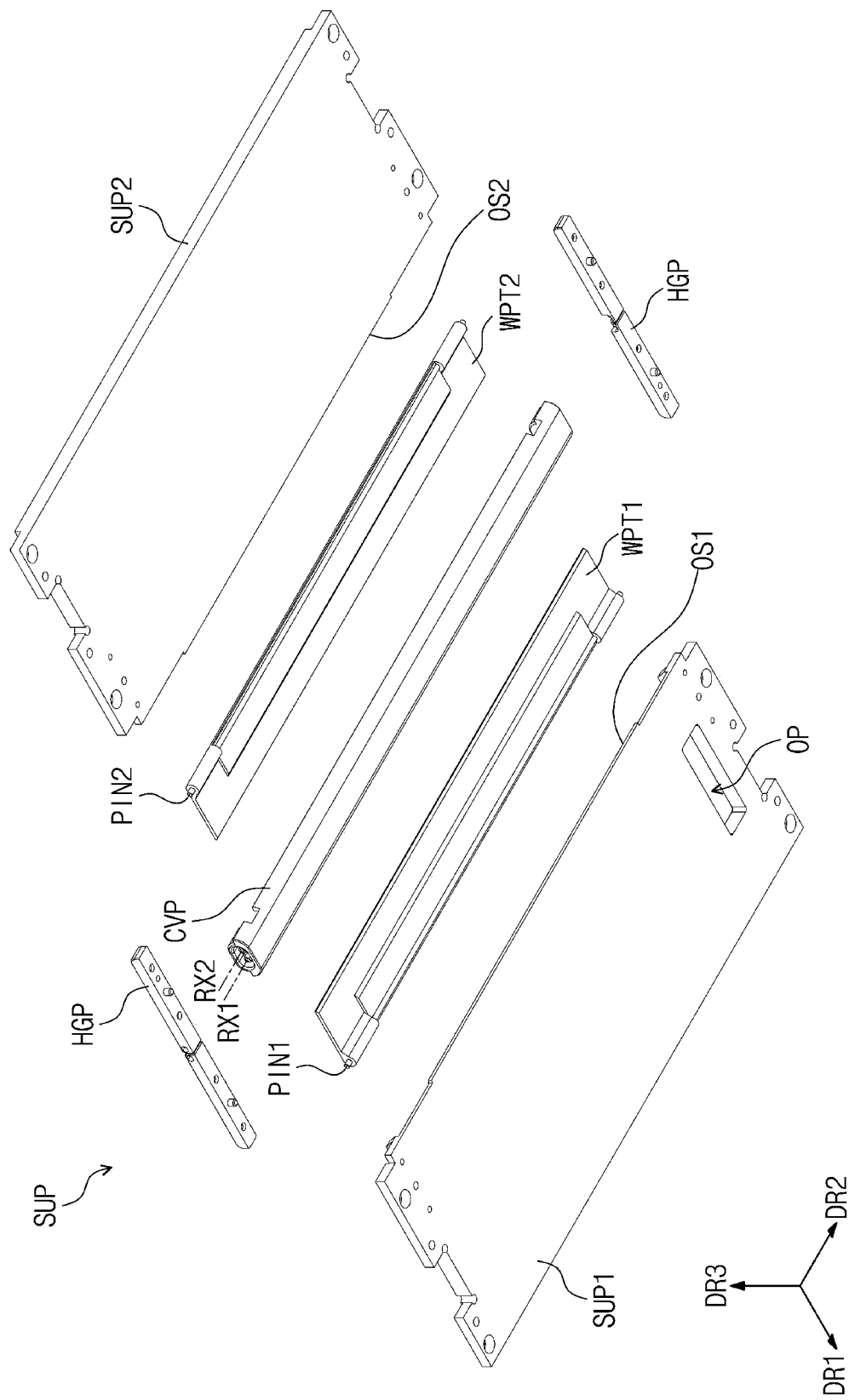
Figure 13:
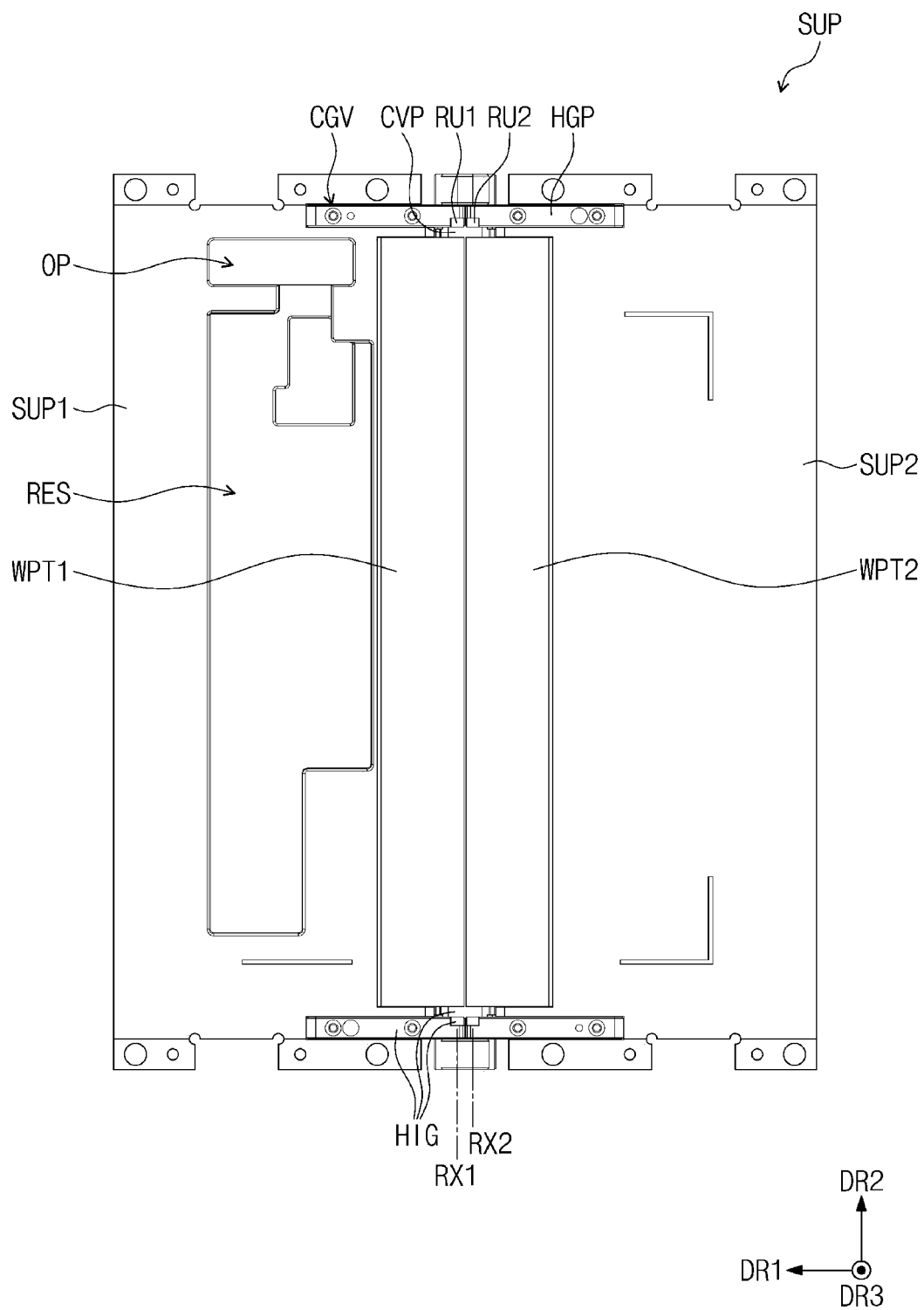
FIG. 13 is a plan view illustrating the support obtained by coupling first and second supports, first and second wing plates, and a hinge in FIGS. 11 and 12.

FIGS. 11 and 12 are exploded perspective views illustrating a support on which the display module DM and the support plate SPT in FIG. 6 are disposed. FIG. 13 is a plan view illustrating the support obtained by coupling first and second supports, first and second wing plates, and a hinge in FIGS. 11 and 12.

FIG. 11 is an upper exploded perspective view illustrating a support SUP when viewed from above the support SUP, and FIG. 12 is a lower exploded perspective view illustrating the support SUP when viewed from below the support SUP.

Referring to FIGS. 11, 12, and 13, the display device DD may include the support SUP, and the support SUP may include a first support SUP1, a second support SUP2, a first wing plate WPT1, a second wing plate WPT2, and a hinge HIG. The first support SUP1 and the second support SUP2 may be arranged in the first direction DR1. The first support SUP1 and the second support SUP2 may have a plane defined by the first and second directions DR1 and DR2.

A recessed portion RES may be defined in a top surface of the first support SUP1. Although not shown, various components may be disposed in the recessed portion RES. For example, a battery for supplying power to the display module DM or a system board for providing a driving signal to the display module DM may be disposed in the recessed portion RES. An opening OP disposed adjacent to the recessed portion RES may be defined in the first support SUP1. A sensor or a camera may be disposed in the opening OP.

The top surface of the first support SUP1 may be adjacent to a side OS1 of the first support SUP1, facing the second support SUP2 and may have a first inclined surface SLP1. The first inclined surface SLP1 may have a height that gradually decreases in a direction toward the side OS1 of the first support SUP1. The recessed portion RES may be adjacent to the first inclined surface SLP1.

A top surface of the second support SUP2 may be adjacent to a side OS2 of the second support SUP2, facing the first support SUP1 and may have a second inclined surface SLP2. The second inclined surface SLP2 may have a height that gradually decreases in a direction toward the side OS2 of the second support SUP2.

The first wing plate WPT1 may be disposed on the first support SUP1 and connected to the first support SUP1. The first wing plate WPT1 may be disposed on the first inclined surface SLP1 and rotatably coupled to an upper side of the first inclined surface SLP1, which is the most away from the side OS1 of the first support SUP1.

A first connection pin PIN1 extending in the second direction DR2 and connected to the first support SUP1 may be disposed at a side of the first wing plate WPT1. The side of the first wing plate WPT1 may overlap the upper side of the first inclined surface SLP1. The first connection pin PIN1 may have a substantially cylindrical shape extending in the second direction DR2.

The second wing plate WPT2 may be disposed on the second support SUP2 and connected to the second support SUP2. The second wing plate WPT2 may be disposed on the second inclined surface SLP2 and rotatably coupled to an upper side of the second inclined surface SLP2, which is the most away from the side OS2 of the second support SUP2.

A second connection pin PIN2 extending in the second direction DR2 and connected to the second support SUP2 may be disposed at a side of the second wing plate WPT2. The side of the second wing plate WPT2 may overlap the upper side of the second inclined surface SLP2. The second connection pin PIN2 may have a substantially cylindrical shape extending in the second direction DR2.

The hinge HIG may be connected to the first support SUP1 and the second support SUP2. The hinge HIG may include a biaxial rotation shaft RX1 and RX2 between the first support SUP1 and the second support SUP2. The biaxial rotation shaft RX1 and RX2 may include a first rotation shaft RX1 and a second rotation shaft RX2, which may be spaced apart from each other in the first direction DR1 and may extend in parallel to each other in the second direction DR2.

The hinge HIG may include hinge parts HGP, a cover part CVP, and first and second rotation units RU1 and RU2. The hinge parts HGP may be connected to sides of the first support SUP1, which may be opposite to each other, and sides of the second support SUP2, which may be opposite to each other.

For example, coupling grooves CGV may be defined in the sides of the first support SUP1 and the sides of the second support SUP2, and the hinge parts HGP may be disposed in the coupling grooves CGV. The coupling grooves CGV may be defined from the side OS1 of the first support SUP1 and the side OS2 of the second support SUP2. Although not shown, connection pins for coupling the hinge parts HGP to the coupling grooves CGV may be provided on the hinge parts HGP.

The cover part CVP may extend in the second direction DR2 and may be disposed between the first support SUP1 and the second support SUP2. A groove GOV extending in the second direction DR2 may be defined in the cover part CVP.

A pair of the first and second rotation units RU1 and RU2 may be connected to ends of the cover part CVP, respectively, which are opposite to each other in the second direction DR2. Each of the ends of the cover part CVP, which are opposite to each other in the second direction DR2, may have a substantially sidewall shape. The pair of the first and second rotation units RU1 and RU2 may be spaced apart from each other in the first direction DR1 and may each extend in the second direction DR2.

The first rotation shaft RX1 may be defined by the first rotation unit RU1, and the second rotation shaft RX2 may be defined by the second rotation unit RU2. The first rotation unit RU1 may rotate around the first rotation shaft RX1, and the second rotation unit RU2 may rotate around the second rotation shaft RX2.

The hinge part HGP may be connected to the first and second rotation units RU1 and RU2. In detail, sides of the hinge parts HGP facing each other in the first direction DR1 may be connected to the first rotation unit RU1 and the second rotation unit RU2. Thus, the hinge parts HGP may rotate around the first and second rotation shafts RX1 and RX2 by the first and second rotation units RU1 and RU2.

For example, two hinge parts HGP arranged in the first direction DR1 may be connected to the pair of first and second rotation units RU1 and RU2. In addition, other two hinge parts HGP arranged in the first direction DR1 may be connected to the other pair of first and second rotation units RU1 and RU2.

Figure 14:
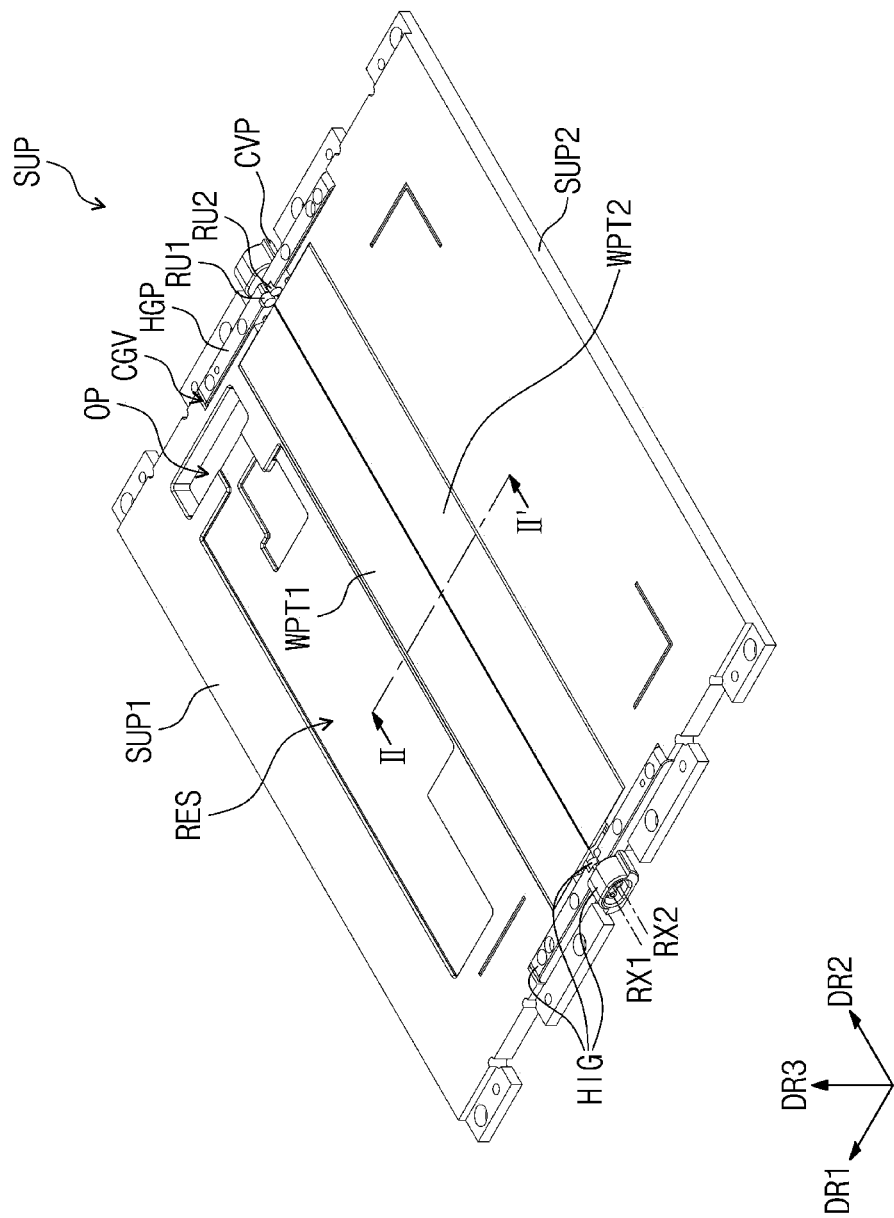
FIG. 14 is a perspective view illustrating the support in FIG. 13.
Figure 15:
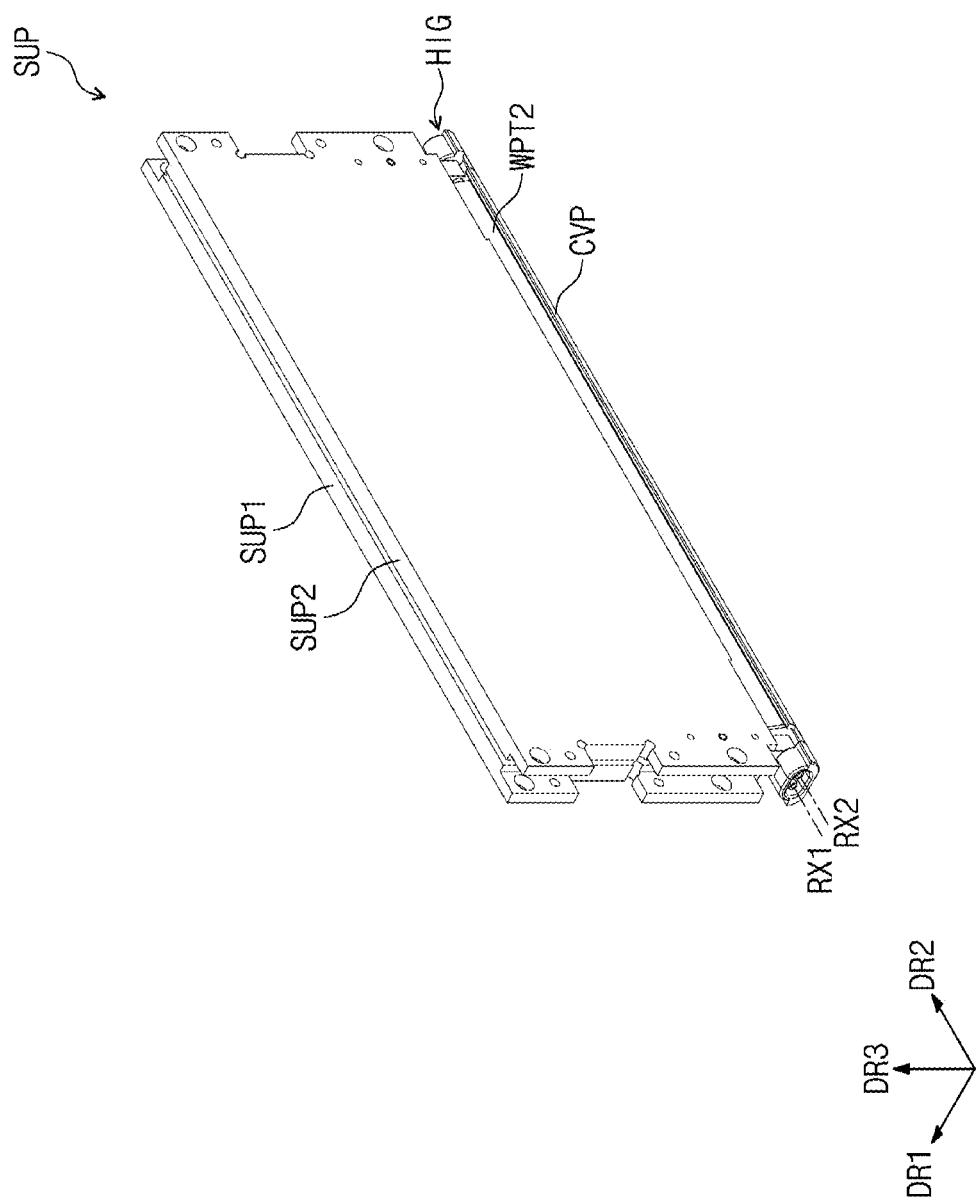
FIG. 15 is a view illustrating a folded state of the support in FIG. 14.

FIG. 14 is a perspective view illustrating the support in FIG. 13. FIG. 15 is a view illustrating a folded state of the support in FIG. 14.

Referring to FIGS. 14 and 15, the hinge parts HGP connected to the first and second rotation units RU1 and RU2 may rotate around the first and second rotation shafts RX1 and RX2 so that the support part SUP is folded. The first and second supports SUP1 and SUP2 connected to the hinge parts HGP may move while rotating around the first and second rotation shafts RX1 and RX2 as the hinge parts HGP rotate.

The first support SUP1 and the second support SUP2 may move by rotating in opposite directions. The first support SUP1 may move by rotating in a clockwise direction around the first rotation shaft RX1. The second support SUP2 may move by rotating in a counterclockwise direction around the second rotation shaft RX2. Thus, as the support SUP is folded, the top surface of the first support SUP1 and the top surface of the first support SUP1 may face each other.

Figure 16:
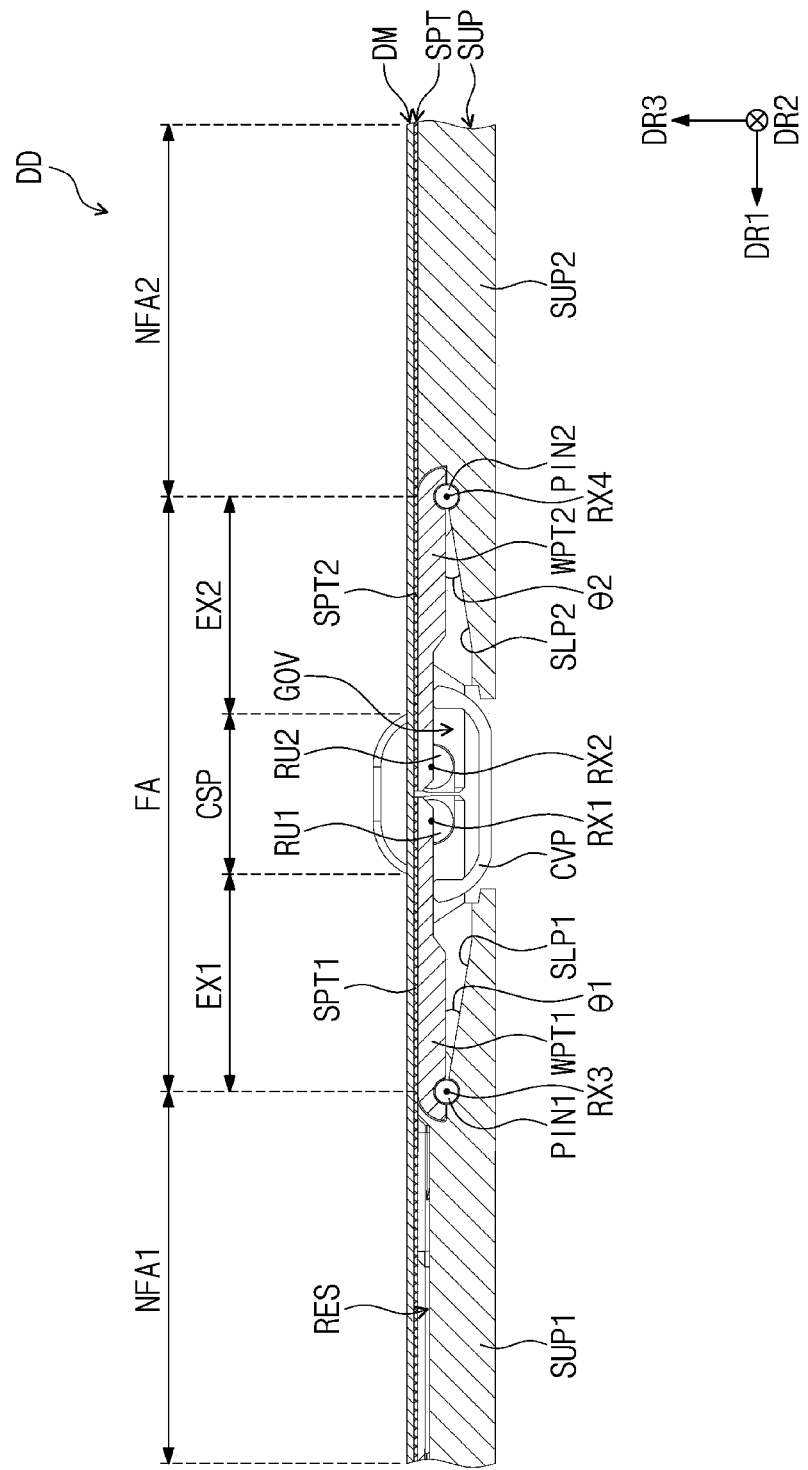
FIG. 16 is a schematic cross-sectional view taken along line II-II' of FIG. 14.
Figure 17:
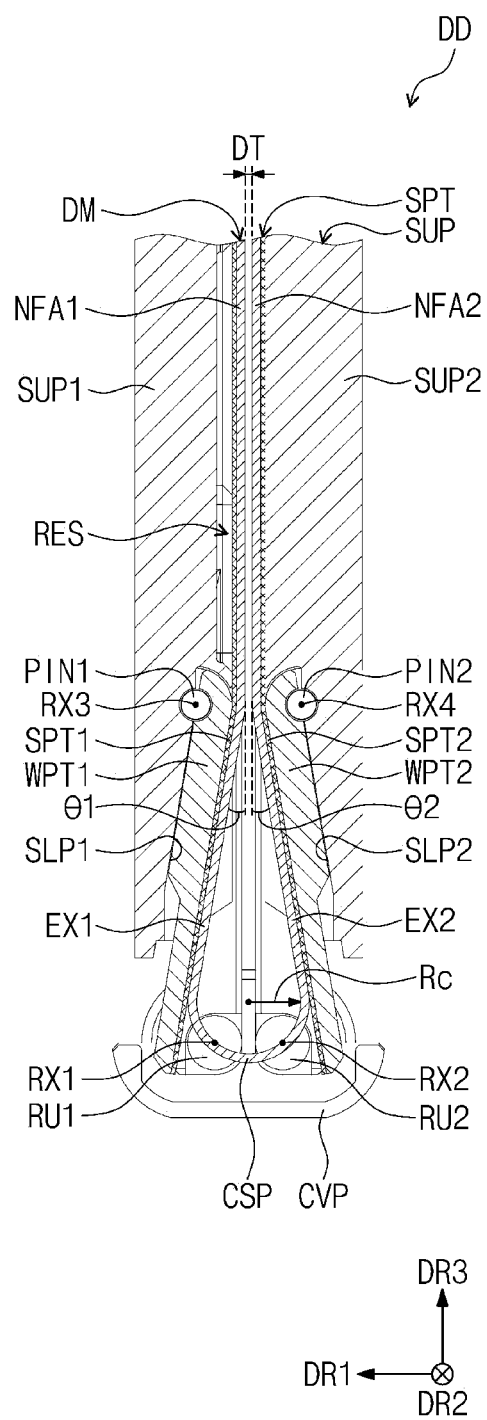
FIG. 17 is a view illustrating a folded state of the display device in FIG. 16.

FIG. 16 is a schematic cross-sectional view taken along line II-II' of FIG. 14. FIG. 17 is a view illustrating a folded state of the display device in FIG. 16.

As an example, the display module DM and the support plate SPT are illustrated in conjunction with the support SUP in FIGS. 16 and 17. In addition, the cushion layer CUL, the insulating tape ITP, the impact absorbing layer ISL, which are disposed below the support plate SPT, and the black coating layer BCT disposed on the support plate SPT are omitted.

Referring to FIG. 16, the display module DM and the support plate SPT may be disposed on the support SUP. The display module DM and the support plate SPT may be in an unfolded state that is defined as a flat state. The first and second rotation shafts RX1 and RX2 may be defined below the curved part CSP of the folding area FA.

In a case that the display module DM is in the unfolded state, the folding area FA may have a length of about 35 mm to about 45 mm in the first direction DR1. The distance between the first points P1_1, P1_2, and P1_3 and the second points P21, P2_2, and P2_3 may be substantially defined as the length of the folding area FA.

In a case that the display module DM is in the unfolded state, each of the first and second support plates SPT1 and SPT2 may have a thickness of about 80 µm to about 150 µm in the third direction DR3. The respective thicknesses of the first and second support plates SPT1 and SPT2 may be the above-described first, second, and third thicknesses TH1, TH2, and TH3.

The first support SUP1 may be disposed below the first non-folding area NFA1. The second support SUP2 may be disposed below the second non-folding area NFA2. The first support plate SPT1 may be disposed between the first support SUP1 and the first non-folding area NFA1. The second support plate SPT2 may be disposed between the second support SUP2 and the second non-folding area NFA2.

The first support plate SPT1 may extend below the first extension part EX1, and the second support plate SPT2 may extend below the second extension part EX2. When viewed on the plane while facing the first extension part EX1, the top surface of the first support SUP1 overlapping the first extension part EX1 may be defined as the first inclined surface SLP1. When viewed on the plane while facing the second extension part EX2, the top surface of the second support SUP2 overlapping the second extension part EX2 may be defined as the second inclined surface SLP2.

The first wing plate WPT1 may be disposed between the first extension part EX1 and the first inclined surface SLP1. The first wing plate WPT1 may be rotatably coupled to a portion of the first support SUP1 overlapping a boundary between the first non-folding area NFA1 and the first extension part EX1 when viewed on the plane.

The first wing plate WPT1 may rotate around a third rotation shaft RX3 extending in the second direction DR2. The third rotation shaft RX3 may be defined by the first connection pin PIN1. The portion of the first support SUP1, which overlaps the boundary between the first non-folding area NFA1 and the first extension part EX1, may be defined as the upper side of the first inclined surface SLP1.

The second wing plate WPT2 may be disposed between the second extension part EX2 and the second inclined surface SLP2. The second wing plate WPT2 may be rotatably coupled to a portion of the second support SUP2 overlapping a boundary between the second non-folding area NFA2 and the second extension part EX2 when viewed on the plane.

The second wing plate WPT2 may rotate around a fourth rotation shaft RX4 extending in the second direction DR2. The fourth rotation shaft RX4 may be defined by the second connection pin PIN2. The portion of the second support SUP2, which overlaps the boundary between the second non-folding area NFA2 and the second extension part EX2, may be defined as the upper side of the second inclined surface SLP2.

The first wing plate WPT1 and the second wing plate WPT2 may be symmetric to each other. The first inclined surface SLP1 and the second inclined surface SLP2 may be symmetric to each other. A distance between the first wing plate WPT1 and the first inclined surface SLP1 may increase in a direction toward the curved part CSP while the display module DM and the support SUP are unfolded. In addition, a distance between the second wing plate WPT2 and the second inclined surface SLP2 may increase in a direction toward the curved part CSP while the display module DM and the support SUP are unfolded.

The first wing plate WPT1 and the first inclined surface SLP1 may make a first angle $\theta1$ while the display module DM and the support SUP are unfolded. The first angle $\theta1$ may be in a range from about 6.5° to about 12.5°. The first angle $\theta1$ may be equal to the above-described first angles $\theta1\_1$, $\theta1\_2$, or $\theta1\_3$. A second angle $\theta2$ between the second wing plate WPT2 and the second inclined surface SLP2 may be equal to the first angle $\theta1$.

A structure of the support SUP may be determined depending on the test results described in FIGS. 8 to 10. For example, the first and second wing plates WPT1 and WPT2 may overlap the folding area FA having a length of about 35 mm to about 45 mm. In addition, the first angle $\theta1$ between the first inclined surface SLP1 and the first wing plate WPT1 may be determined as the above-described first angles $\theta1\_1$, $\theta1\_2$, or $\theta1\_3$. The first angles $\theta1\_1$, $\theta1\_2$, and $\theta1\_3$ may be numerical values determined in consideration of the thicknesses TH1, TH2, and TH3 of the support plates SPT\_1, SPT\_2, and SPT\_3.

The cover part CVP may be disposed between the first support SUP1 and the second support SUP2. The cover part CVP may be disposed below the first and second wing plates WPT1 and WPT2. A portion of the first wing plate WPT1 and a portion of the second wing plate WPT2 may be disposed on the cover part CVP. The groove GOV defined in the cover part CVP may face the curved part CSP.

The first rotation shaft RX1 and the second rotation shaft RX2 may overlap the curved part CSP and the groove GOV when viewed on the plane. In addition, the first rotation shaft RX1 and the second rotation shaft RX2 may overlap the groove GOV when viewed in the second direction DR2.

Referring to FIG. 17, as the first and second supports SUP1 and SUP2 rotate around the first and second rotation shafts RX1 and RX2, respectively, the display module DM may be folded. The folding area FA may be bent to have a curvature radius Rc in a range of about 1.5 mm to about 5.0 mm. The display module DM may be in-folded so that the first non-folding area NFA1 and the second non-folding area NFA2 face each other. The distance DT between the first non-folding area NFA1 and the second non-folding area NFA2 may be less than the curvature radius Rc.

In a case that the display module DM is folded, the first wing plate WPT1 may rotate around the third rotation shaft RX3 to contact the first inclined surface SLP1 according to the stress of the folding area FA. In a case that the display module DM is folded, the second wing plate WPT2 may rotate around the fourth rotation shaft RX4 to contact the second inclined surface SLP2 according to the stress of the folding area FA.

In a case that the display module DM is folded, the first support plate SPT1 may be bent at the boundary between the first non-folding area NFA1 and the first extension part EX1 by the first wing plate WPT1. In a case that the display module DM is folded, the second support plate SPT2 may be bent at the boundary between the second non-folding area NFA2 and the second extension part EX2 by the second wing plate WPT2.

In a case that the display module DM is folded, a central portion of the curved part CSP may be disposed in the groove GOV. In addition, in a case that the display module DM is folded, the side of the first wing plate WPT1 and the side of the second wing plate WPT2, which face each other, may be disposed in the groove GOV.

As described in FIGS. 8 to 10, in a case that the support plates SPT\_1, SPT\_2, and SPT\_3 are bent at the first angles $\theta1\_1$, $\theta1\_2$, and $\theta1\_3$, respectively, according to the thicknesses TH1, TH2, and TH3 of the support plates SPT\_1, SPT\_2, and SPT\_3, the curved part CSP may have a predetermined curvature radius Rc.

As the first wing plate WPT1 and the first inclined surface SLP1 have the first angle $\theta1$ therebetween in a case that the display module DM is unfolded, and the first wing plate WPT1 and the first inclined surface SLP1 contact each other in a case that the display module DM is folded, the first extension part EX1 may form the first angle $\theta1$ with the first reference line RFL1.

Likewise, as the second wing plate WPT2 contacts the second inclined surface SLP2, the second extension part EX2 may form the second angle $\theta1$ with the second reference line RFL2. Thus, in a case that the display module DM is folded, the curved part CSP of the folding area FA may be bent to have a curvature radius Re in a range of about 1.5 mm to about 5.0 mm.

Figure 18:
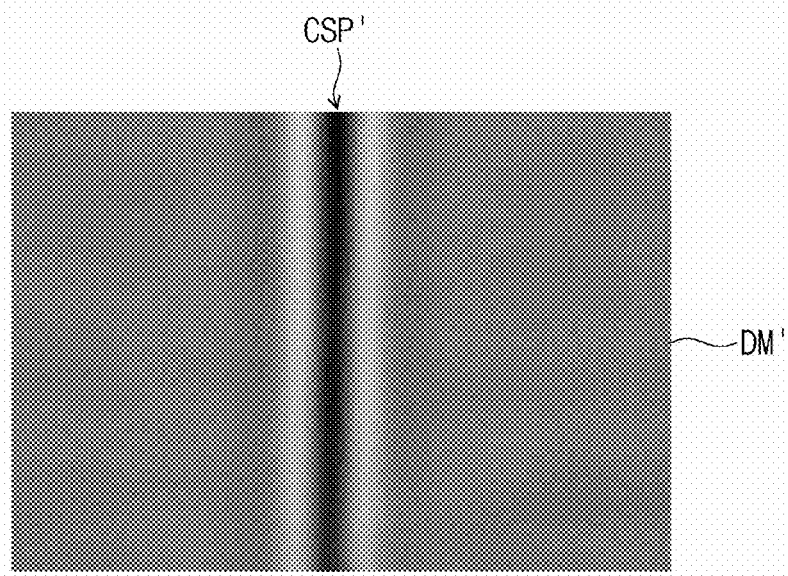
FIG. 18 is an enlarged photograph illustrating a folding area of a comparative display module.
Figure 19:
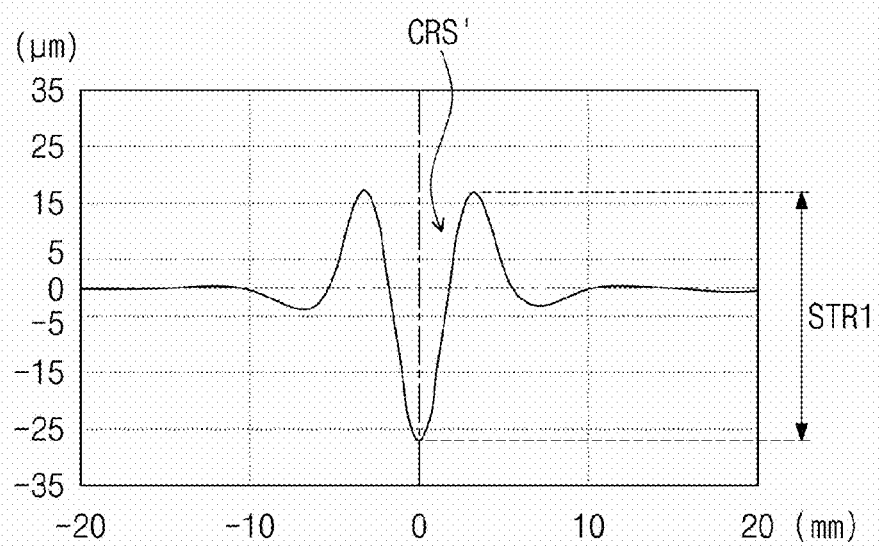
FIG. 19 is a graph showing a deformed state of the folding area in FIG. 18.
Figure 20:
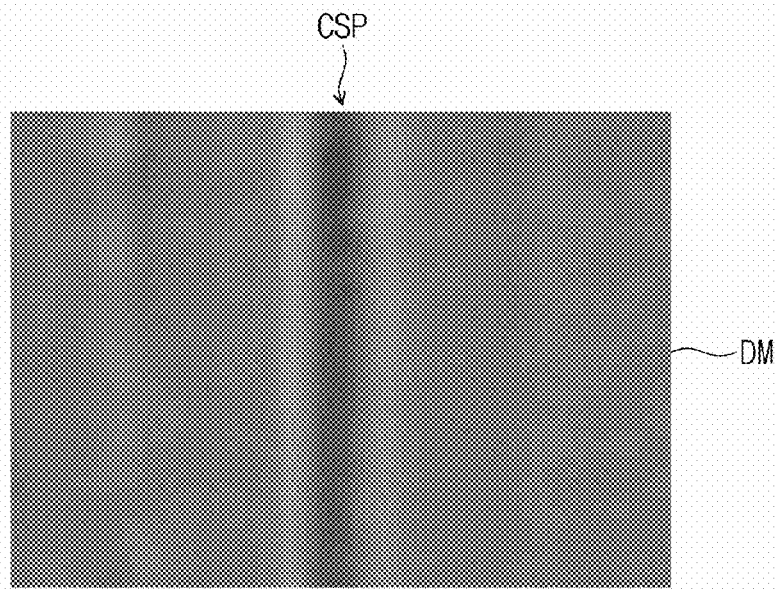
FIG. 20 is an enlarged photograph showing the folding area of the display module according to an embodiment.
Figure 21:
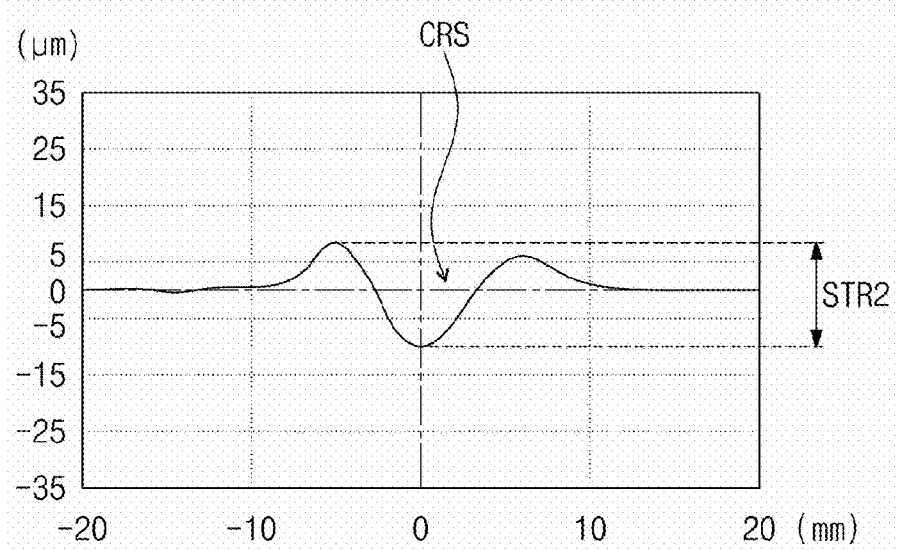
FIG. 21 is a graph showing a deformed state of the folding area in FIG. 20.

FIG. 18 is an enlarged photograph showing a folding area of a comparative display module. FIG. 19 is a graph showing a deformed state of the folding area in FIG. 18. FIG. 20 is an enlarged photograph showing the folding area of the display module according to an embodiment. FIG. 21 is a graph showing a deformed state of the folding area in FIG. 20.

A comparative display module DM' in FIG. 18 may be folded instead of having a dumbbell structure and may have a curvature radius different from the curvature radius Rc.

Horizontal axes in FIGS. 19 and 21 represent distances from central portions of curved parts CSP' and CSP in the first direction DR1. Vertical axes in FIGS. 19 and 21 represent deformation of the curved parts CSP' and CSP in the third direction DR3.

FIGS. 18 and 20 are photographs obtained by photographing the curved parts CSP' and CSP in a state in which the comparative display module DM' and the display module DM are folded, the folded state thereof is maintained for a predetermined time, the comparative display module DM' and the display module DM are unfolded, and a predetermined time has elapsed.

Referring to FIGS. 18 and 19, a crease CRS' may be generated in the curved part CSP' of the comparative display module DM'. A difference between a maximum height and a minimum height of the crease CRS' may be defined as a first deformation STR1.

Referring to FIGS. 20 and 21, a crease CRS may be generated in the curved part CSP of the display module DM. A difference between a maximum height and a minimum height of the crease CRS may be defined as a second deformation STR2.

Referring to FIGS. 18 to 21, the first deformation STR1 of the curved part CSP' may be greater than the second deformation STR2 of the curved part CSP. Thus, the crease CRS' generated in the curved part CSP' may be more clearly recognized. In addition, the crease CRS generated in the curved part CSP may not be recognized.

In an embodiment, as the folding area FA is bent into the substantially dumbbell shape, and the curved part CSP may be bent to have a curvature radius Rc of about 1.5 mm to about 5.0 mm, and thus deformation of the folding area FA may be reduced.

Figure 22:
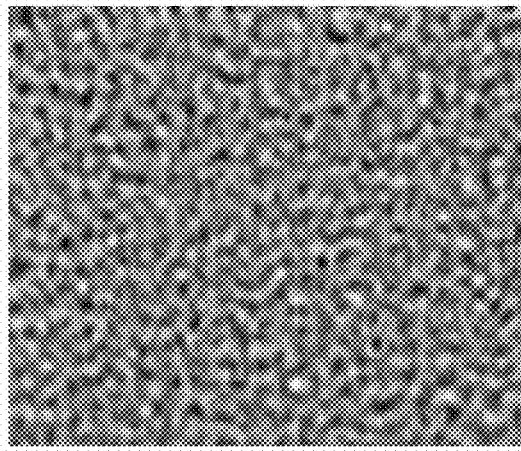
FIG. 22 is an enlarged photograph showing a surface of the comparative display module.
Figure 23:
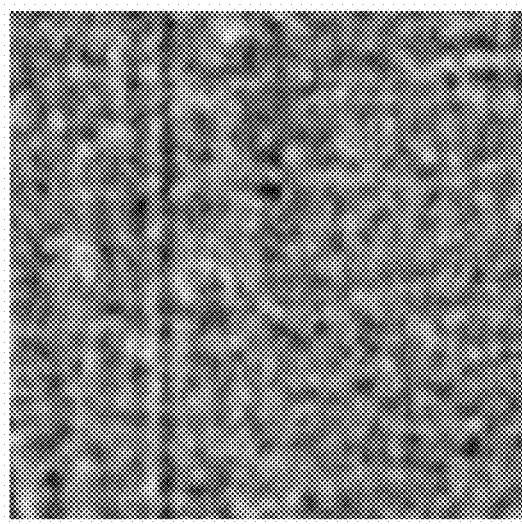
FIG. 23 is an enlarged photograph showing a surface of the display module in FIG. 6.

FIG. 22 is an enlarged photograph showing a surface of the comparative display module. FIG. 23 is an enlarged photograph showing a surface of the display module in FIG. 6.

A surface of the display module DM may be defined as the top surface of the display module DM. A surface of a comparative display module DM" may be defined as a top surface of the comparative display module DM".

FIGS. 22 and 23 are photographs obtained by capturing surfaces by using Optimap PSD, which is a coating surface measurement analyzer, of Rhopoint instruments.

Referring to FIGS. 22 and 23, a window of the comparative display module DM" may have a thickness of about 30 μm. As described above, the window WIN of the display module DM may have a thickness greater than about 30 μm and equal to or less than about 80 μm. For example, the window WIN of the display module DM in FIG. 23 may have a thickness of about 50 m.

The window WIN of the display module DM may have a greater thickness. The comparative display module DM" including the window having a smaller thickness had a surface quality index of about 0.46 Kc. The display module DM including the window WIN having a greater thickness had a surface quality index of about 0.34 Kc.

As the surface quality index (Kc) decreases, an object to be measured may have a smoother surface. Thus, the display module DM may have a surface quality index greater than that of the display module DM'. The display module DM may have a top surface smoother than that of the display module DM'.

According to the embodiment, the deformation of the folding area may be reduced as the folding area is folded to have the curvature radius capable of minimizing the deformation of the folding area.

Although embodiments have been described, it is understood that the disclosure should not be limited to these embodiments but rather various changes and modifications can be made by one of ordinary skill in the art within the spirit and scope of the disclosure as hereinafter claimed. Thus, the scope of the disclosure is to be determined by the broadest permissible interpretation of the following claims and their equivalents, and shall not be restricted or limited by the foregoing detailed description.

What is claimed is:

1. A display device comprising:
 a display module comprising a first non-folding area, a second non-folding area, and a folding area disposed between the first non-folding area and the second non-folding area, the first non-folding area, the second non-folding area, and the folding area being arranged in a first direction;
 a first support disposed below the first non-folding area;
 a second support disposed below the second non-folding area; and
 a hinge including a biaxial rotation shaft disposed between the first support and the second support, the biaxial rotation shaft extending in a second direction intersecting the first direction,
 wherein the folding area has a curvature radius in a range of 1.5 mm to 5.0 mm when the display module is folded by a rotation of the first support and the second support with respect to the biaxial rotation shaft, and the folding area has a length in a range of 35 mm to 45 mm.

2. The display device of claim 1, wherein the length of the folding area is in the first direction when the display module is unfolded.

3. The display device of claim 1, wherein the folding area comprises:
 a curved part bent to have the curvature radius when the display module is folded;
 a first extension part bent from the first non-folding area to extend to the curved part; and
 a second extension part bent from the second non-folding area to extend to the curved part,
 wherein a distance between the first non-folding area and the second non-folding area is less than the curvature radius of the curved part of the folding area when the display module is folded.

4. The display device of claim 3, wherein
 the first extension part and the second extension part are symmetric when the display module is folded, and
 the first extension part forms an acute angle with a first reference line extending from the first non-folding area to the curved part in a same direction as an extension direction of the first non-folding area when the display module is folded.

5. The display device of claim 4, wherein the acute angle is in a range of about 6.5° to about 12.5°.

6. The display device of claim 3, further comprising:
 a first support plate disposed between the first support and the first non-folding area; and
 a second support plate disposed between the second support and the second non-folding area, wherein
 the first support plate extends below the first extension part and the curved part,
 the second support plate extends below the second extension part and the curved part, and
 the first support plate is spaced apart from the second support plate below the curved part.

7. The display device of claim 6, wherein
 the first support plate and the second support plate are attached to the first non-folding area, the second non-folding area, the first extension part, and the second extension part, and
 the first support plate and the second support plate are not attached to the curved part.

8. The display device of claim 6, wherein
 the first support plate is bent at a boundary between the first non-folding area and the first extension part when the display module is folded, and the second support plate is bent at a boundary between the second non-folding area and the second extension part when the display module is folded.

9. The display device of claim 6, wherein each of the first support plate and the second support plate has a thickness in a range of about 80 μm to about 150 μm in a third direction perpendicular to a plane defined by the first and second directions when the display module is unfolded.

10. The display device of claim 6, further comprising:
a black coating layer coated on each of a top surface of the first support plate and a top surface of the second support plate;
a first cushion layer disposed below the first support plate; and
a second cushion layer disposed below the second support plate.

11. The display device of claim 3, wherein
the first support extends below the first extension part,
the second support extends below the second extension part,
a top surface of the first support facing the first extension part has a first inclined surface in a plan view, and
a top surface of the second support facing the second extension part has a second inclined surface in the plan view.

12. The display device of claim 11, further comprising:
a first wing plate disposed between the first extension part and the first inclined surface of the top surface of the first support and rotatably connected to a portion of the first support, wherein the portion of the first support overlaps a boundary between the first non-folding area and the first extension part in a plan view; and
a second wing plate disposed between the second extension part and the second inclined surface of the top surface of the second support and rotatably connected to a portion of the second support, wherein the portion of the second support overlaps a boundary between the second non-folding area and the second extension part in a plan view,
wherein the first wing plate and the second wing plate rotate with respect to a first rotation shaft and a second rotation shaft extending in the second direction.

13. The display device of claim 12, wherein
the second wing plate is symmetric to the first wing plate,
the second inclined surface of the top surface of the second support is symmetric to the first inclined surface of the top surface of the first support,
a distance between the first wing plate and the first inclined surface of the top surface of the first support increases in a direction toward the curved part when the display module is unfolded, and
the first inclined surface of the top surface of the first support forms an angle in a range of about 6.5° to about 12.5° with the first wing plate when the display module is unfolded.

14. The display device of claim 12, wherein the first wing plate contacts the first inclined surface of the top surface of the first support, and the second wing plate contacts the second inclined surface of the top surface of the second support upon a stress of the folding area when the display module is folded.

15. The display device of claim 12, wherein the hinge comprises:
a cover part disposed between the first support and the second support and below the first wing plate and the second wing plate;
a first rotation unit and a second rotation unit connected to opposite ends of the cover part in the second direction; and
a plurality of hinge parts connected to opposite sides of the first support and the second support in the second direction, and the first rotation unit and the second rotation unit, wherein
the cover part includes a groove facing the curved part and extending in the second direction, and
the biaxial rotation shaft overlaps the curved part and the groove in a plan view.

16. The display device of claim 15, a side of the first wing plate and a side of the second wing plate facing each other, and a central portion of the curved part are disposed in the groove when the display module is folded.

17. The display device of claim 1, wherein the first non-folding area faces the second non-folding area when the display module is in-folded.

18. A display device comprising:
a display module comprising a first non-folding area, a second non-folding area, and a folding area disposed between the first non-folding area and the second non-folding area, the first non-folding area, the second non-folding area, and the folding area being arranged in a first direction;
a first support disposed below the first non-folding area; and
a second support disposed below the second non-folding area,
wherein the display module is folded by rotation of the first support and the second support with respect to biaxial rotation shafts disposed below the folding area,
wherein the folding area comprises:
a curved part bent to have a predetermined curvature radius when the display module is folded;
a first extension part disposed between the first non-folding area and the curved part; and
a second extension part disposed between the second non-folding area and the curved part,
wherein the folding area has a length in a range of 35 mm to 45 mm in the first direction when the display module is unfolded, and
wherein the first extension part forms an angle in a range of 6.5° to 12.5° with a first reference line extending from the first non-folding area to the curved part in a same direction as an extension direction of the non-folding area when the display module is folded.

19. The display device of claim 18, wherein the curved part of the folding area is bent to have a predetermined curvature radius in a range of about 1.5 mm to about 5.0 mm.

* * * * *